United States Patent
Watts et al.

(10) Patent No.: US 10,580,827 B1
(45) Date of Patent: Mar. 3, 2020

(54) ADJUSTABLE STABILIZER/POLARIZER METHOD FOR MRAM WITH ENHANCED STABILITY AND EFFICIENT SWITCHING

(71) Applicant: Spin Memory, Inc., Fremont, CA (US)

(72) Inventors: Steven Watts, San Jose, CA (US);
Georg Martin Wolf, San Francisco, CA (US); Kadriye Deniz Bozdag, Sunnyvale, CA (US); Bartlomiej Kardasz, Pleasanton, CA (US); Mustafa Pinarbasi, Morgan Hill, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 16/192,972

(22) Filed: Nov. 16, 2018

(51) Int. Cl.
| | |
|---|---|
| *G11C 11/00* | (2006.01) |
| *H01L 27/22* | (2006.01) |
| *H01L 43/08* | (2006.01) |
| *G11C 11/16* | (2006.01) |
| *H01F 10/32* | (2006.01) |
| *H01F 10/30* | (2006.01) |

(52) U.S. Cl.
CPC .......... *H01L 27/228* (2013.01); *G11C 11/161* (2013.01); *H01F 10/30* (2013.01); *H01F 10/3254* (2013.01); *H01F 10/3272* (2013.01); *H01L 43/08* (2013.01)

(58) Field of Classification Search
CPC ..... H01L 27/228; H01L 43/08; G11C 11/161; H01F 10/30; H01F 10/3254; H01F 10/3272
USPC ......................................................... 365/158
See application file for complete search history.

(56) References Cited

U.S. PATENT DOCUMENTS

| | | |
|---|---|---|
| 341,801 A | 5/1886 | Fox |
| 5,541,868 A | 7/1996 | Prinz |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |
| 5,856,897 A | 1/1999 | Mauri |
| 5,896,252 A | 4/1999 | Kanai |

(Continued)

FOREIGN PATENT DOCUMENTS

| | | |
|---|---|---|
| CA | 2766141 A1 | 1/2011 |
| CN | 101036195 A | 9/2008 |

(Continued)

OTHER PUBLICATIONS

Notice of Allowance dated Oct. 2, 2019 in U.S. Appl. No. 16/123,663.

(Continued)

*Primary Examiner* — Huan Hoang
(74) *Attorney, Agent, or Firm* — Arnold & Porter Kaye Scholer

(57) ABSTRACT

A magnetoresistive random-access memory (MRAM) is disclosed. The MRAM bit cell consists of a magnetic tunnel junction stack having a significantly improved performance of the magnetic storage layer. The MRAM device utilizes a polarizer layer with a magnetic vector that can switch between a stabilizing magnetic direction and a programming magnetic direction.

37 Claims, 10 Drawing Sheets

(56) References Cited

U.S. PATENT DOCUMENTS

| | | |
|---|---|---|
| 5,966,323 A | 10/1999 | Chen et al. |
| 6,016,269 A | 1/2000 | Peterson et al. |
| 6,055,179 A | 4/2000 | Koganei et al. |
| 6,097,579 A | 8/2000 | Gill |
| 6,124,711 A | 9/2000 | Tanaka et al. |
| 6,134,138 A | 10/2000 | Lu et al. |
| 6,140,838 A | 10/2000 | Johnson |
| 6,154,349 A | 11/2000 | Kanai et al. |
| 6,172,902 B1 | 1/2001 | Wegrowe et al. |
| 6,233,172 B1 | 5/2001 | Chen et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,272,036 B1 | 8/2001 | You et al. |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,154 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,149,106 B2 | 12/2006 | Mancoff et al. |
| 7,170,778 B2 | 1/2007 | Kent et al. |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,324,387 B1 | 1/2008 | Bergemont et al. |
| 7,335,960 B2 | 2/2008 | Han et al. |
| 7,351,594 B2 | 4/2008 | Bae et al. |
| 7,352,021 B2 | 4/2008 | Bae et al. |
| 7,376,006 B2 | 5/2008 | Bednorz et al. |
| 7,378,699 B2 | 5/2008 | Chan et al. |
| 7,449,345 B2 | 11/2008 | Horng et al. |
| 7,476,919 B2 | 1/2009 | Hong et al. |
| 7,502,249 B1 | 3/2009 | Ding |
| 7,573,737 B2 | 8/2009 | Kent et al. |
| 7,598,555 B1 | 10/2009 | Papworth-Parkin |
| 7,619,431 B2 | 11/2009 | DeWilde et al. |
| 7,630,232 B2 | 12/2009 | Guo |
| 7,643,332 B2 | 1/2010 | Leuschner |
| 7,679,155 B2 | 3/2010 | Korenivski |
| 7,911,832 B2 | 3/2011 | Kent et al. |
| 7,936,595 B2 | 5/2011 | Han et al. |
| 7,986,544 B2 | 7/2011 | Kent et al. |
| 8,014,193 B2 | 9/2011 | Nakayama et al. |
| 8,279,663 B2 | 10/2012 | Nakayama et al. |
| 8,279,666 B2 | 10/2012 | Dieny et al. |
| 8,334,213 B2 | 12/2012 | Mao |
| 8,357,982 B2 | 1/2013 | Kajiyama |
| 8,363,465 B2 | 1/2013 | Kent et al. |
| 8,456,883 B1 | 6/2013 | Liu |
| 8,488,375 B2 | 7/2013 | Saida et al. |
| 8,492,881 B2 | 7/2013 | Kuroiwa et al. |
| 8,508,979 B2 | 8/2013 | Saida et al. |
| 8,535,952 B2 | 9/2013 | Ranjan et al. |
| 8,574,928 B2 | 11/2013 | Satoh et al. |
| 8,576,616 B2 | 11/2013 | Saida et al. |
| 8,582,355 B2 | 11/2013 | Saida et al. |
| 8,617,408 B2 | 12/2013 | Balamane |
| 8,716,817 B2 | 5/2014 | Saida et al. |
| 8,737,122 B2 | 5/2014 | Saida et al. |
| 8,737,137 B1 | 5/2014 | Choy et al. |
| 8,779,537 B2 | 7/2014 | Huai |
| 8,823,118 B2 | 9/2014 | Horng |
| 8,852,760 B2 | 10/2014 | Wang et al. |
| 8,860,156 B2 | 10/2014 | Beach |
| 8,878,317 B2 | 11/2014 | Daibou et al. |
| 9,019,754 B1 | 4/2015 | Bedeschi |
| 9,025,368 B2 | 5/2015 | Saida et al. |
| 9,082,888 B2 | 7/2015 | Kent et al. |
| 9,117,995 B2 | 8/2015 | Daibou et al. |
| 9,129,690 B2 | 9/2015 | Park et al. |
| 9,159,342 B2 | 10/2015 | Kudo et al. |
| 9,245,608 B2 | 1/2016 | Chen et al. |
| 9,263,667 B1 | 2/2016 | Pinarbasi |
| 9,299,918 B2 | 3/2016 | Daibou et al. |
| 9,337,412 B2 | 5/2016 | Pinarbasi et al. |
| 9,362,486 B2 | 6/2016 | Kim et al. |
| 9,378,817 B2 | 6/2016 | Lee et al. |
| 9,379,314 B2 | 6/2016 | Park |
| 9,406,876 B2 | 8/2016 | Pinarbasi |
| 9,472,282 B2 | 10/2016 | Lee et al. |
| 9,472,748 B2 | 10/2016 | Kuo et al. |
| 9,484,527 B2 | 11/2016 | Han et al. |
| 9,548,445 B2 | 1/2017 | Lee et al. |
| 9,589,616 B2 | 3/2017 | Meng et al. |
| 9,728,712 B2 | 8/2017 | Kardasz et al. |
| 9,741,926 B1 | 8/2017 | Pinarbasi et al. |
| 9,773,540 B2 | 9/2017 | Zang et al. |
| 9,773,974 B2 | 9/2017 | Pinarbasi et al. |
| 9,777,974 B2 | 10/2017 | Kamitani et al. |
| 9,818,464 B2 | 11/2017 | Saida et al. |
| 9,853,206 B2 | 12/2017 | Pinarbasi et al. |
| 10,008,248 B2 | 6/2018 | Buhrman et al. |
| 10,026,892 B2 | 7/2018 | Pinarbasi et al. |
| 10,032,978 B1 | 7/2018 | Schabes et al. |
| 10,229,724 B1 | 3/2019 | el Baraji et al. |
| 10,236,047 B1 | 3/2019 | Ryan et al. |
| 10,236,048 B1 | 3/2019 | Tzoufras et al. |
| 10,236,439 B1 | 3/2019 | Schabes et al. |
| 10,270,027 B1 | 4/2019 | Gajek et al. |
| 10,360,961 B1 | 7/2019 | Tzoufras et al. |
| 10,468,588 B2 | 11/2019 | Schabes et al. |
| 10,468,590 B2 | 11/2019 | Kardasz et al. |
| 2002/0090533 A1 | 7/2002 | Zhang et al. |
| 2002/0105823 A1 | 8/2002 | Redon et al. |
| 2002/0132140 A1 | 9/2002 | Igarashi et al. |
| 2003/0117840 A1 | 6/2003 | Sharma et al. |
| 2003/0151944 A1 | 8/2003 | Saito |

(56) References Cited

U.S. PATENT DOCUMENTS

| | | |
|---|---|---|
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0061154 A1 | 4/2004 | Huai et al. |
| 2004/0094785 A1 | 5/2004 | Zhu et al. |
| 2004/0125649 A1 | 7/2004 | Durlam et al. |
| 2004/0130936 A1 | 7/2004 | Nguyen et al. |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0174702 A1 | 8/2005 | Gill |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0002184 A1 | 1/2006 | Hong et al. |
| 2006/0018057 A1 | 1/2006 | Huai |
| 2006/0044703 A1 | 3/2006 | Inomata et al. |
| 2006/0049472 A1 | 3/2006 | Diao et al. |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0047294 A1 | 3/2007 | Panchula |
| 2007/0096229 A1 | 5/2007 | Yoshikawa et al. |
| 2007/0242501 A1 | 10/2007 | Hung et al. |
| 2008/0031035 A1 | 2/2008 | Rodmacq et al. |
| 2008/0049488 A1 | 2/2008 | Rizzo |
| 2008/0112094 A1 | 5/2008 | Kent et al. |
| 2008/0151442 A1 | 6/2008 | Mauri et al. |
| 2008/0151614 A1 | 6/2008 | Guo |
| 2008/0164547 A1 | 7/2008 | Higo et al. |
| 2008/0185670 A1 | 8/2008 | Kajiyama |
| 2008/0259508 A2 | 10/2008 | Kent et al. |
| 2008/0273274 A1 | 11/2008 | Kojima et al. |
| 2008/0297292 A1 | 12/2008 | Viala et al. |
| 2009/0015958 A1 | 1/2009 | Nakamura et al. |
| 2009/0046501 A1 | 2/2009 | Raritan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0161421 A1 | 6/2009 | Cho et al. |
| 2009/0209050 A1 | 8/2009 | Wang et al. |
| 2009/0209102 A1 | 8/2009 | Zhong et al. |
| 2009/0231909 A1 | 9/2009 | Dieny et al. |
| 2009/0244792 A1 | 10/2009 | Nakayama et al. |
| 2010/0019333 A1 | 1/2010 | Zhao et al. |
| 2010/0124091 A1 | 5/2010 | Cowburn |
| 2010/0193891 A1 | 8/2010 | Wang et al. |
| 2010/0232206 A1 | 9/2010 | Li |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2010/0304204 A1 | 12/2010 | Routkevitch et al. |
| 2011/0001108 A1 | 1/2011 | Greene et al. |
| 2011/0032645 A1 | 2/2011 | Noel et al. |
| 2011/0058412 A1 | 3/2011 | Zheng et al. |
| 2011/0089511 A1 | 4/2011 | Keshtbod et al. |
| 2011/0121417 A1 | 5/2011 | Li |
| 2011/0133298 A1 | 6/2011 | Chen et al. |
| 2011/0141804 A1 | 6/2011 | Apalkov et al. |
| 2011/0149632 A1 | 6/2011 | Chen et al. |
| 2011/0216436 A1 | 9/2011 | Igarashi |
| 2011/0235217 A1 | 9/2011 | Chen et al. |
| 2011/0305077 A1 | 12/2011 | Higo et al. |
| 2012/0012952 A1 | 1/2012 | Chen et al. |
| 2012/0052258 A1 | 3/2012 | Op DeBeeck et al. |
| 2012/0069649 A1 | 3/2012 | Ranjan et al. |
| 2012/0120520 A1 | 5/2012 | Childress et al. |
| 2012/0155156 A1 | 6/2012 | Watts |
| 2012/0156390 A1 | 6/2012 | Araki |
| 2012/0181642 A1 | 7/2012 | Prejbeanu et al. |
| 2012/0188818 A1 | 7/2012 | Ranjan et al. |
| 2012/0228728 A1 | 9/2012 | Ueki et al. |
| 2012/0280336 A1 | 11/2012 | Jan |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0062714 A1 | 3/2013 | Zhu |
| 2013/0075845 A1 | 3/2013 | Chen et al. |
| 2013/0119495 A1 | 5/2013 | Vetro et al. |
| 2013/0157385 A1 | 6/2013 | Jung et al. |
| 2013/0181305 A1 | 7/2013 | Nakayama et al. |
| 2013/0244344 A1 | 9/2013 | Malmhall et al. |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0036573 A1 | 2/2014 | Ishihara et al. |
| 2014/0042571 A1 | 2/2014 | Gan et al. |
| 2014/0048896 A1 | 2/2014 | Huang et al. |
| 2014/0070341 A1 | 3/2014 | Beach et al. |
| 2014/0087483 A1 | 3/2014 | Ohsawa |
| 2014/0093701 A1 | 4/2014 | Sahoo et al. |
| 2014/0103472 A1 | 4/2014 | Kent et al. |
| 2014/0103473 A1 | 4/2014 | Kent et al. |
| 2014/0131824 A1 | 5/2014 | Kitagawa et al. |
| 2014/0159175 A1 | 6/2014 | Lee et al. |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0252519 A1 | 9/2014 | Kim |
| 2014/0264671 A1 | 9/2014 | Chepulskyy et al. |
| 2015/0008550 A1 | 1/2015 | Min et al. |
| 2015/0056368 A1 | 2/2015 | Wang et al. |
| 2015/0171315 A1 | 6/2015 | Gan et al. |
| 2015/0171316 A1 | 6/2015 | Park et al. |
| 2015/0279904 A1 | 10/2015 | Pinarbasi |
| 2015/0287910 A1 | 10/2015 | Lu |
| 2015/0357015 A1 | 12/2015 | Kent et al. |
| 2015/0372687 A1 | 12/2015 | Buhrman et al. |
| 2016/0027999 A1 | 1/2016 | Pinarbasi et al. |
| 2016/0087193 A1 | 3/2016 | Pinarbasi et al. |
| 2016/0093798 A1 | 3/2016 | Kim et al. |
| 2016/0099405 A1 | 4/2016 | Zimmer et al. |
| 2016/0111634 A1 | 4/2016 | Lee et al. |
| 2016/0126452 A1 | 5/2016 | Kuo et al. |
| 2016/0126453 A1 | 5/2016 | Chen et al. |
| 2016/0163965 A1 | 6/2016 | Han et al. |
| 2016/0163973 A1 | 6/2016 | Pinarbasi |
| 2016/0181508 A1 | 6/2016 | Lee et al. |
| 2016/0218278 A1 | 7/2016 | Pinarbasi et al. |
| 2016/0276006 A1 | 9/2016 | Ralph et al. |
| 2016/0284762 A1 | 9/2016 | Wang et al. |
| 2016/0315118 A1 | 10/2016 | Kardasz et al. |
| 2016/0315259 A1 | 10/2016 | Kardasz et al. |
| 2016/0372656 A1 | 12/2016 | Pinarbasi et al. |
| 2017/0018705 A1 | 1/2017 | Harms et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0033742 A1 | 2/2017 | Akerman |
| 2017/0047107 A1 | 2/2017 | Berger et al. |
| 2017/0084826 A1 | 3/2017 | Zhou et al. |
| 2017/0222132 A1 | 8/2017 | Pinarbasi et al. |
| 2017/0236570 A1 | 8/2017 | Kent et al. |
| 2017/0324029 A1 | 11/2017 | Pinarbasi et al. |
| 2017/0331032 A1 | 11/2017 | Chen et al. |
| 2017/0331033 A1 | 11/2017 | Kardasz et al. |
| 2017/0346002 A1 | 11/2017 | Pinarbasi et al. |
| 2018/0047894 A1 | 2/2018 | Pinarbasi et al. |

(56) References Cited

U.S. PATENT DOCUMENTS

| | | | |
|---|---|---|---|
| 2018/0076382 | A1 | 3/2018 | Park et al. |
| 2018/0114898 | A1 | 4/2018 | Lee |
| 2018/0205001 | A1 | 7/2018 | Beach et al. |
| 2018/0248110 | A1 | 8/2018 | Kardasz et al. |
| 2018/0248113 | A1 | 8/2018 | Pinarbasi et al. |
| 2019/0304653 | A1* | 10/2019 | Oguz .............. H01L 27/228 |

FOREIGN PATENT DOCUMENTS

| | | |
|---|---|---|
| CN | 102334207 A | 1/2012 |
| CN | 102959693 A | 3/2013 |
| CN | 105706259 A | 6/2016 |
| CN | 105917480 A | 8/2016 |
| CN | 106062979 A | 10/2016 |
| CN | 107750382 A | 3/2018 |
| CN | 107851712 A | 3/2018 |
| EP | 1345277 A1 | 9/2003 |
| EP | 3298636 A1 | 3/2018 |
| FR | 2817998 A1 | 6/2002 |
| FR | 2832542 A1 | 5/2003 |
| FR | 2910716 A1 | 6/2008 |
| JP | H10-4012 A | 1/1998 |
| JP | H11-120758 A | 4/1999 |
| JP | H11-352867 A | 12/1999 |
| JP | 2001-195878 A | 7/2001 |
| JP | 2002-261352 A | 9/2002 |
| JP | 2002-357489 A | 12/2002 |
| JP | 2003-318461 A | 11/2003 |
| JP | 2005-044848 | 2/2005 |
| JP | 2005-150482 A | 6/2005 |
| JP | 2005-535111 A | 11/2005 |
| JP | 4066477 B2 | 3/2006 |
| JP | 2006-128579 A | 5/2006 |
| JP | 2008-098365 | 4/2008 |
| JP | 2008-524830 A | 7/2008 |
| JP | 2008-192832 | 8/2008 |
| JP | 2009-027177 A | 2/2009 |
| JP | 2012-004222 | 1/2012 |
| JP | 2013-012546 A | 1/2013 |
| JP | 2013-048210 | 3/2013 |
| JP | 2013-219010 A | 10/2013 |
| JP | 2014-022751 | 2/2014 |
| JP | 2014-039061 A | 2/2014 |
| JP | 5635666 B2 | 12/2014 |
| JP | 2015-002352 A | 1/2015 |
| JP | 2017-510989 A | 4/2017 |
| JP | 2017-527097 A | 9/2017 |
| JP | 2017-532752 A | 11/2017 |
| KR | 10-2014-0115246 | 9/2014 |
| KR | 10-2015-0016162 | 2/2015 |
| WO | WO-2009-080636 A1 | 7/2009 |
| WO | WO-2011-005484 A2 | 1/2011 |
| WO | WO 2013/027406 | 2/2013 |
| WO | WO-2014-062681 | 4/2014 |
| WO | WO-2015-153142 A1 | 10/2015 |
| WO | WO-2016-011435 A1 | 1/2016 |
| WO | WO-2016-014326 A1 | 1/2016 |
| WO | WO-2016-048603 A1 | 3/2016 |
| WO | WO-2016-171800 A1 | 10/2016 |
| WO | WO-2016-171920 A1 | 10/2016 |
| WO | WO-2016-204835 A1 | 12/2016 |
| WO | WO-2017-019134 A1 | 2/2017 |
| WO | WO-2017-030647 A1 | 2/2017 |
| WO | WO-2017-131894 A1 | 8/2017 |
| WO | WO 2017/151735 A1 | 9/2017 |

OTHER PUBLICATIONS

Notice of Allowance dated Oct. 4, 2019 in U.S. Appl. No. 16/027,739.
NonFinal Office Action dated Aug. 15, 2019 in U.S. Appl. No. 15/674,620.
NonFinal Office Action dated Sep. 4, 2019 in U.S. Appl. No. 15/445,260.
NonFinal Office Action dated Sep. 16, 2019 in U.S. Appl. No. 15/445,362.
NonFinal Office Action dated Jun. 25, 2019 in U.S. Appl. No. 16/197,622.
Notice of Allowance dated Jun. 26, 2019 in U.S. Appl. No. 15/091,853.
Office Action dated Jul. 23, 2019 in Japanese Patent Application No. 2016-529428 (with English translation).
NonFinal Office Action dated Mar. 22, 2019 in U.S. Appl. No. 16/027,739.
Notice of Allowance dated Mar. 21, 2019 in U.S. Appl. No. 15/858,950.
Restriction Requirement in U.S. Appl. No. 16/123,663 dated Apr. 24, 2019.
Berger et al.; U.S. Appl. No. 15/174,482, filed Jun. 6, 2016, entitled "Method and Apparatus for Bipolar Memory Write-Verify".
Bozdag et al.; U.S. Appl. No. 15/859,047, filed Dec. 29, 2017, entitled "Three-Terminal MRAM with AC Write-Assist for Low Read Disturb".
El Baraji et al.; U.S. Appl. No. 15/859,514, filed Dec. 30, 2017, entitled "Microwave Write-Assist in Orthogonal STT-MRAM".
El Baraji et al.; U.S. Appl. No. 15/859,517, filed Dec. 30, 2017, entitled "Microwave Write-Assist in Series-Interconnected Orthogonal STT-MRAM Devices".
Extended European Search Report dated Jan. 30, 2019 in EU Application No. 16812075.6.
Final Office Action dated Jul. 9, 2015 in U.S. Appl. No. 14/242,419; 19 pages.
Final Office Action dated Jun. 9, 2017 in U.S. Appl. No. 14/814,038; 19 pages.
Final Office Action dated Nov. 8, 2018 in U.S. Appl. No. 15/445,260.
Final Office Action dated Aug. 2, 2018 in U.S. Appl. No. 15/674,620.
Final Office Action dated Nov. 16, 2018 in U.S. Appl. No. 15/445,362.
Final Office Action dated Dec. 13, 2018 in U.S. Appl. No. 15/091,853.
Gajek et al.; U.S. Appl. No. 15/858,988, filed Dec. 29, 2017, entitled "Self-Generating AC Current Assist in Orthogonal STT MRAM".
Ikeda et al.; "A perpendicular-anisotropy CoFeB—MgO magnetic tunnel junction"; Nature Materials, vol. 9, Sep. 2010; pp. 721-724 (4 pages).
International Search Report and Written Opinion dated Jul. 10, 2015 in PCT/US2015/021580; 12 pages.
International Search Report and Written Opinion dated Oct. 30, 2015 in PCT/US2015/040700; 11 pages.
International Search Report and Written Opinion dated Dec. 14, 2015 in PCT/US2015/047875; 13 pages.
International Search Report and Written Opinion dated Jun. 17, 2016 in PCT/US2016/021324; 9 pages.
International Search Report and Written Opinion dated Jun. 17, 2016 in PCT/US2016/021691; 9 pages.
International Search Report and Written Opinion dated Jul. 15, 2016 in PCT/US2016/026473; 9 pages.
International Search Report and Written Opinion dated Jul. 21, 2016 in PCT/US2016/027445; 10 pages.
International Search Report and Written Opinion dated Sep. 26, 2016 in PCT/US2016/037843; 10 pages.
International Search Report and Written Opinion dated Apr. 7, 2017 in PCT/US2016/067444; 13 pages.
International Search Report and Written Opinion dated May 10, 2018 in PCT/US2018/014645; 14 pages.
International Search Report and Written Opinion dated May 30, 2018 in PCT/US2018/014641; 13 pages.
Kardasz et al.; U.S. Appl. No. 14/866,359, Filed Sep. 25, 2015 entitled "Spin Transfer Torque Structure for MRAM Devices Having a Spin Current Injection Capping Layer".
Kardasz et al.; U.S. Appl. No. 15/091,853, filed Apr. 6, 2016, entitled "High Annealing Temperature Perpendicular Magnetic Anisotropy Structure for Magnetic Random Access Memory".
Kardasz et al.; U.S. Appl. No. 15/657,498, filed Jul. 24, 2017, entitled "Spin Transfer Torque Structure for MRAM Devices Having a Spin Current Injection Capping Layer".
Kent et al.; U.S. Appl. No. 61/715,111, filed Oct. 17, 2012, entitled "Inverted Orthogonal Spin Transfer Layer Stack".

(56) References Cited

OTHER PUBLICATIONS

Koch et al., "Thermally Assisted Magnetization Reversal in Submicron-Sized Magnetic Thin Films"; Physical Review Letters; The American Physical Society; vol. 84, No. 23; Jun. 5, 2000, pp. 5419-5422 (4 pages).
Lee et al., "Analytical investigation of spin-transfer dynamics using a perpendicular-to-plane polarizer"; Applied Physics Letters; American Institute of Physics; vol. 86, (2005); pp. 022505-1 to 022505-3 (3 pages).
"Magnetic Technology Sprintronics, Media and Interface"; Data Storage Institute, R&D Highlights; Sep. 2010; 3 pages.
Martens et al., "Thermally Induced Magnetic Switching in Thin Ferromagnetic Annuli"; NSF grants PHY-0351964 (DLS); 2005; 11 pages.
Martens et al., "Magnetic Reversal in Nanoscopic Ferromagnetic Rings"; NSF grants PHY-0351964 (DLS); 2006; 23 pages.
NonFinal Office Action dated Mar. 20, 2015 in U.S. Appl. No. 14/242,419; 18 pages.
NonFinal Office Action dated Sep. 11, 2015 in U.S. Appl. No. 14/492,943; 13 pages.
NonFinal Office Action dated Jan. 20, 2016 in U.S. Appl. No. 14/242,419; 17 pages.
NonFinal Office Action dated Dec. 9, 2017 in U.S. Appl. No. 14/866,359; 26 pages.
NonFinal Office Action dated Dec. 23, 2016 in U.S. Appl. No. 15/093,367; 13 pages.
NonFinal Office Action dated Jan. 25, 2017 in U.S. Appl. No. 15/097,576; 17 pages.
NonFinal Office Action dated Feb. 6, 2017 in U.S. Appl. No. 14/814,036; 22 pages.
NonFinal Office Action dated Jun. 29, 2018 in U.S. Appl. No. 15/859,381.
Nonfinal Office Action dated Jun. 26, 2018 in U.S. Appl. No. 15/859,384.
NonFinal Office Action dated Jun. 29, 2018 in U.S. Appl. No. 15/859,374.
NonFinal Office Action dated Nov. 23, 2018 in U.S. Appl. No. 15/859,384.
NonFinal Office Action dated Nov. 26, 2018 in U.S. Appl. No. 15/858,950.
NonFinal Office Action dated Jan. 15, 2019 in U.S. Appl. No. 15/862,788.
Notice of Allowance dated Apr. 21, 2017 in U.S. Appl. No. 15/157,783; 36 pages.
Notice of Allowance dated Jul. 27, 2017 in U.S. Appl. No. 15/097,576; 22 pages.
Notice of Allowance dated Oct. 16, 2017 in U.S. Appl. No. 14/814,036; 16 pages.
Notice of Allowance dated Sep. 26, 2018 in U.S. Appl. No. 15/859,047; 10 pages.
Notice of Allowance dated Oct. 24, 2018 in U.S. Appl. No. 15/859,517.
Notice of Allowance dated Nov. 9, 2018 in U.S. Appl. No. 15/859,015.
Notice of Allowance dated Nov. 21, 2018 in U.S. Appl. No. 15/859,030.
Notice of Allowance dated Nov. 21, 2018 in U.S. Appl. No. 15/859,374.
Notice of Allowance dated Nov. 30, 2018 in U.S. Appl. No. 15/859,514.
Notice of Allowance dated Dec. 12, 2018 in U.S. Appl. No. 15/858,988.
Notice of Allowance dated Feb. 12, 2019 in U.S. Appl. No. 15/859,381.
Office Action dated Aug. 30, 2018 in Chinese Patent Application No. 201580009984.2.
Office Action dated Oct. 9, 2018 in Japanese Patent Application No. 2016-526761.
Pinarbasi et al.; U.S. Appl. No. 14/341,185, filed Jul. 25, 2014, entitled "Method for Manufacturing MTJ Memory Device".
Pinarbasi et al.; U.S. Appl. No. 14/492,943, filed Sep. 22, 2014, entitled "Magnetic Tunnel Junction Structure for MRAM Device".
Pinarbasi et al.; U.S. Appl. No. 14/814,036, filed Jul. 30, 2015, entitled "Precessional Spin Current Structure for MRAM".
Pinarbasi et al.; U.S. Appl. No. 15/041,325, filed Feb. 11, 2016, entitled "Method for Manufacturing MTJ Memory Device".
Pinarbasi et al.; U.S. Appl. No. 15/093,367, filed Apr. 7, 2016, entitled "Magnetic Tunnel Junction Structure for MRAM Device".
Pinarbasi et al.; U.S. Appl. No. 15/097,576, filed Apr. 13, 2016, entitled "Polishing Stop Layer(s) for Processing Arrays of Semiconductor Elements".
Pinarbasi et al.; U.S. Appl. No. 15/157,783, filed May 18, 2016, entitled "Memory Cell Having Magnetic Tunnel Junction and Thermal Stability Enhancement Layer".
Pinarbasi et al.; U.S. Appl. No. 15/445,260, filed Feb. 28, 2017, entitled "Precessional Spin Current Structure for MRAM".
Pinarbasi et al.; U.S. Appl. No. 15/445,362, filed Feb. 28, 2017, entitled "Precessional Spin Current Structure for MRAM".
Pinarbasi et al.; U.S. Appl. No. 15/656,398, filed Jul. 21, 2017, entitled "Memory Cell Having Magnetic Tunnel Junction and Thermal Stability Enhancement Layer".
Pinarbasi et al.; U.S. Appl. No. 15/674,620, filed Aug. 11, 2017, entitled "Polishing Stop Layer(s) for Processing Arrays of Semiconductor Elements".
Pinarbasi et al.; U.S. Appl. No. 15/794,871, filed Oct. 26, 2017, entitled "Precessional Spin Current Structure for MRAM".
Ryan et al.; U.S. Appl. No. 15/859,015, filed Dec. 29, 2017, entitled "Shared Oscillator (STNO) for MRAM Array Write-Assist in Orthogonal STT-MRAM".
Schabes et al.; U.S. Appl. No. 15/634,629, filed Jun. 27, 2017, entitled "Mram with Reduced Stray Magnetic Fields".
Schabes et al.; U.S. Appl. No. 15/859,384, filed Dec. 30, 2017, entitled "Perpendicular Magnetic Tunnel Junction Device with Skyrmionic Assist Layers for Free Layer Switching".
Schabes et al.; U.S. Appl. No. 15/859,381, filed Dec. 30, 2017, entitled "Perpendicular Magnetic Tunnel Junction Device with Precessional Spin Current Layer Having a Modulated Moment Density".
Schabes et al.; U.S. Appl. No. 15/859,379, filed Dec. 30, 2017, entitled "Perpendicular Magnetic Tunnel Junction Device with Offset Precessional Spin Current Layer".
Schabes et al.; U.S. Appl. No. 15/859,374, filed Dec. 30, 2017, entitled "Switching and Stability Control for Perpendicular Magnetic Tunnel Junction Device".
Schabes et al.; U.S. Appl. No. 15/862,788, filed Jan. 5, 2018, entitled "Perpendicular Magnetic Tunnel Junction Device with Skyrmionic Enhancement Layers for the Precessional Spin Current Magnetic Layer".
Seo et al.; "Current-induced synchronized switching of magnetization;" Applied Physics Letters 101; 2012 American Institute of Physics; Aug. 7, 2012; 6 pages.
Tzoufras et al.; U.S. Appl. No. 15/858,950, filed Dec. 29, 2017, entitled "AC Current Pre-Charge Write-Assist in Orthogonal STT-MRAM".
Tzoufras et al.; U.S. Appl. No. 15/859,030, filed Dec. 29, 2017, entitled "AC Current Write-Assist in Orthogonal STT-MRAM".

* cited by examiner

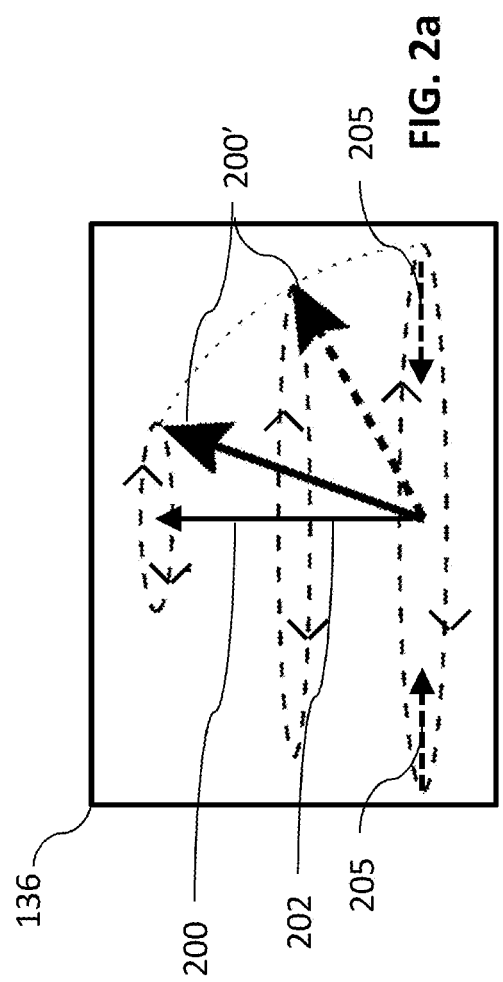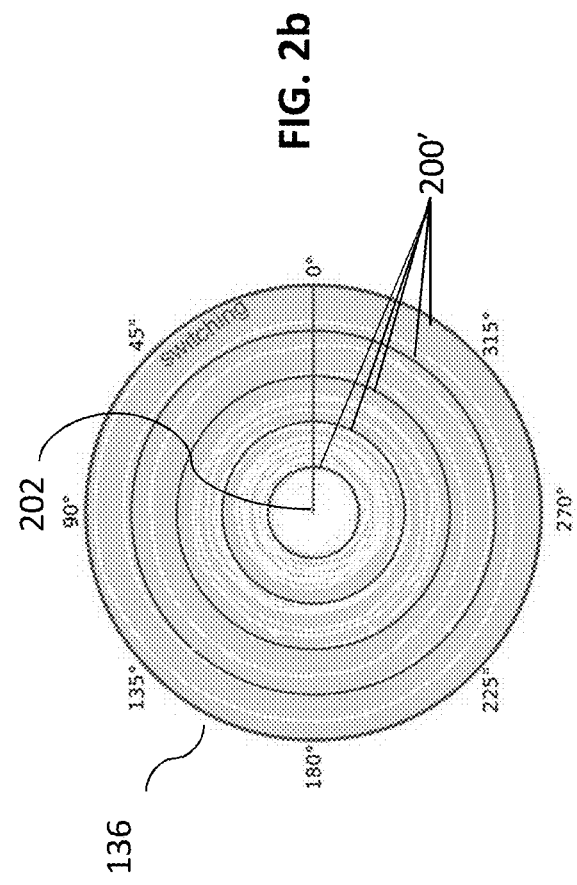

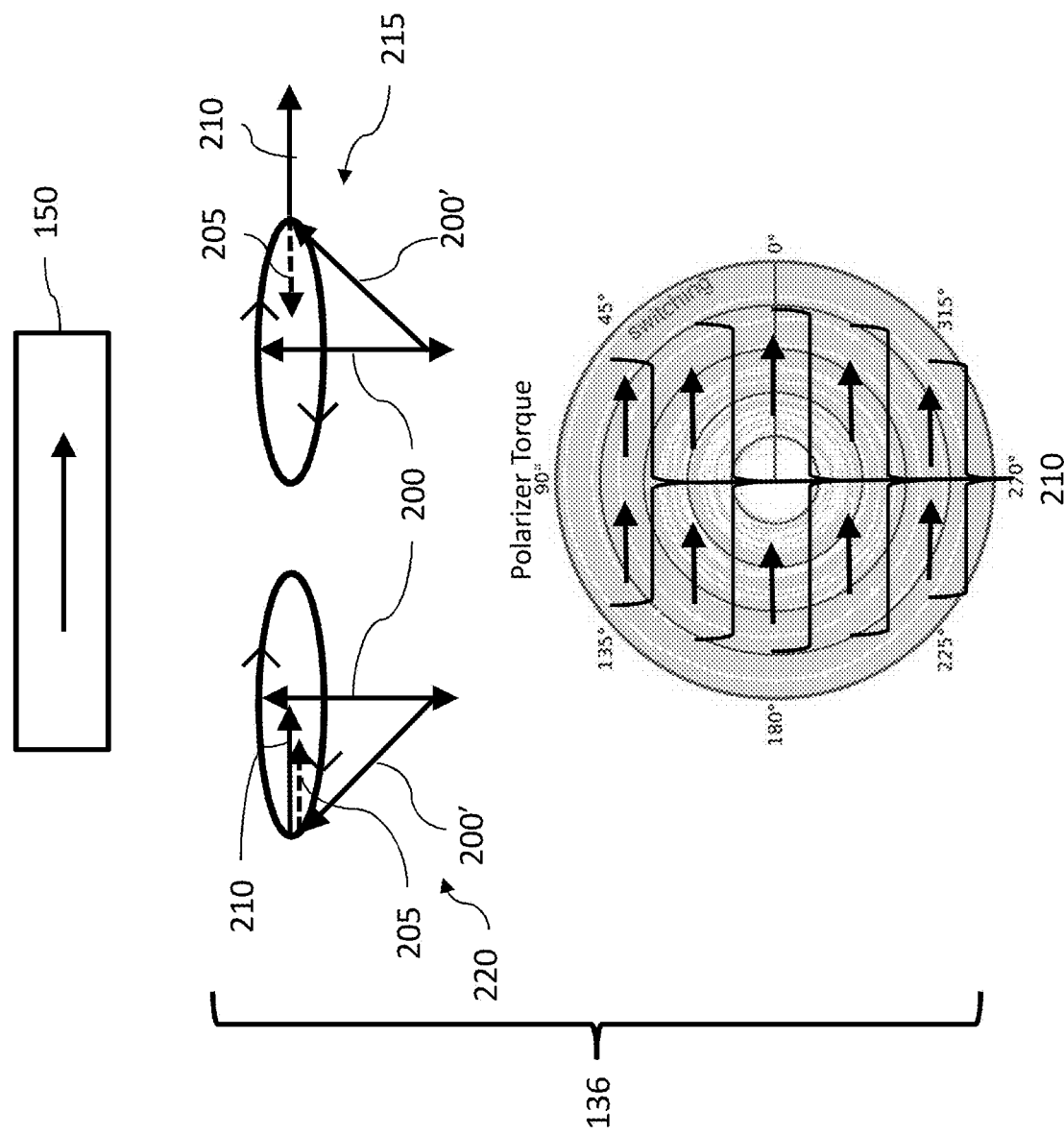

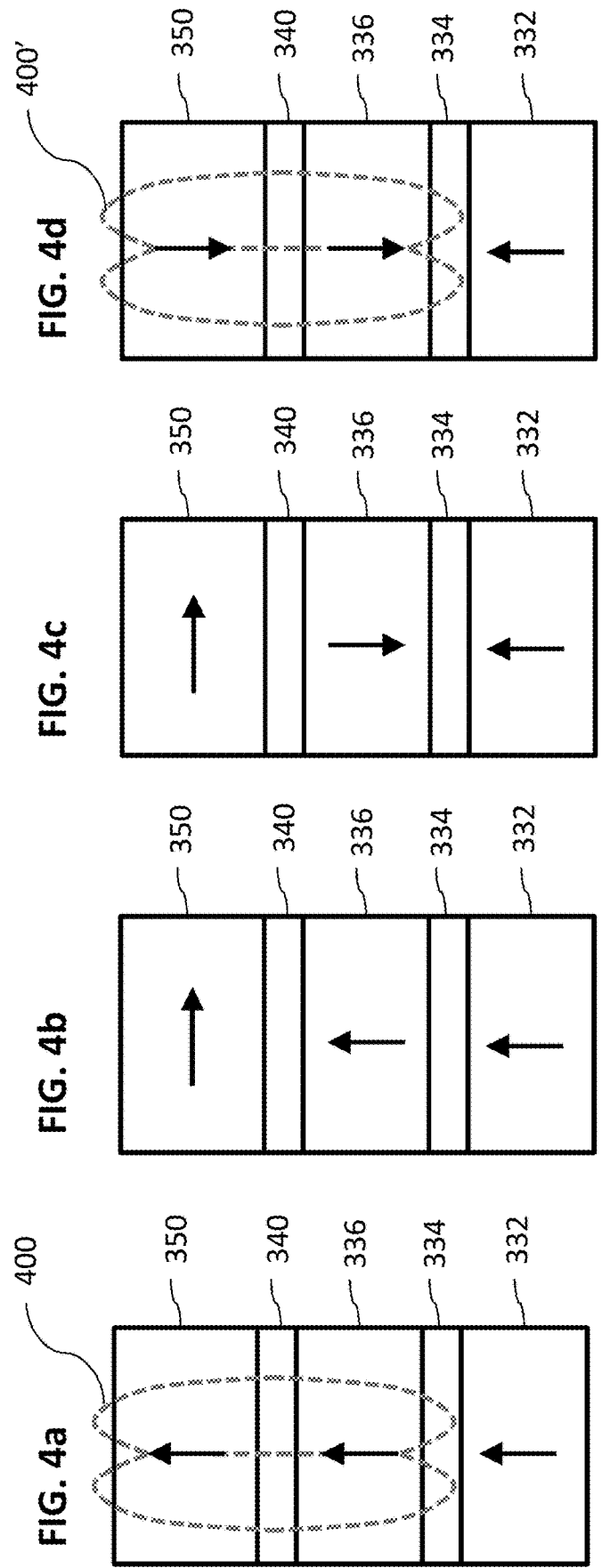

ADJUSTABLE STABILIZER/POLARIZER METHOD FOR MRAM WITH ENHANCED STABILITY AND EFFICIENT SWITCHING

FIELD

The present patent document relates generally to spin-transfer torque magnetic random access memory and, more particularly, to a structure and method to achieve enhanced stability with efficient switching for a bit cell structure in a spin transfer torque-based magnetic random access memory, a class of non-volatile resistive memory technology.

BACKGROUND

Magnetoresistive random-access memory ("MRAM") is a non-volatile memory technology in which the data is stored in a magnetic storage element that makes up the memory bit cell. The magnetic storage element is a ferromagnetic layer (called the "free layer") in a multilayer pillar structure that forms a resistive element connected to a conventional complementary metal-oxide-semiconductor (CMOS) or selector device in an individual bit cell of a memory array. The magnetic orientation of the free layer is typically constrained to align along a particular axis and its direction along that axis (e.g., up or down) defines the binary state of the data storage. In perpendicular MRAM devices, this axis is parallel to the long axis of the pillar and perpendicular to the plane of the individual layers.

The magnetic orientation of the free layer is measured with respect to another ferromagnetic layer (the "reference layer") that has a magnetic orientation strongly pinned in one of the directions along the axis (e.g., up). The free and reference layers are separated by a non-magnetic spacer layer. In the most common application the spacer layer is a thin oxide insulator such as MgO and the free and reference layers are ferromagnetic metals, forming a tri-layer structure called a magnetic tunnel junction (MTJ).

MRAM devices store information by changing the orientation of the magnetization of the free layer. In particular, based on whether the free layer is in a parallel or anti-parallel magnetic alignment relative to the reference layer, either a "1" or a "0" can be stored in each MRAM cell. Due to the spin-polarized electron tunneling effect, the electrical resistance of the cell depends on the relative orientation of the magnetizations of the two layers. The bit cell resistance is therefore different for the parallel and anti-parallel states and thus the cell resistance can be used to distinguish between a "1" and a "0". One important feature of MRAM devices is that they are non-volatile memory devices, since they maintain the information even when the power is off. However at high memory array densities the bit cells become quite small so the magnetic anisotropy of the free layer and reference layer needs to be large enough to withstand thermal fluctuations.

Spin transfer torque or spin transfer switching, uses spin-aligned ("polarized") electrons to change the magnetization orientation of the free layer in the magnetic tunnel junction. In general, electrons possess a spin, a quantized number of angular momentum intrinsic to the electron. An electrical current is generally unpolarized, i.e., it consists of 50% spin up and 50% spin down electrons. Passing a current though a magnetic layer polarizes electrons with the spin orientation corresponding to the magnetization direction of the magnetic layer (i.e., polarizer), thus producing a spin-polarized current. If a spin-polarized current flows into the free layer in the magnetic tunnel junction device, the electrons will transfer a portion of their spin-angular momentum to the free layer thereby producing a torque on the magnetization of the free layer. Thus, this spin transfer torque can switch the magnetization of the free layer, which, in effect, writes either a "1" or a "0" based on whether the free layer is in the parallel or anti-parallel state relative to the reference layer.

When a current is passed through a magnetic layer (e.g., a polarizer), the spin orientation of the electrons that flow out of the magnetic layer is generally aligned in the direction of the magnetization of the magnetic layer and will exert a spin-transfer torque in that direction (forming a transverse spin current) upon injection into another magnetic layer. However, due to the conservation of angular moment for the system, the electrons on the opposite side of magnetic layer, those that do not go through the magnetic layer, generally have a spin orientation that is aligned in the direction that is anti-parallel to the magnetization direction of the magnetic layer. The net effect of this process is that the current applied to the magnetic layer undergoes spin filtering, which creates a spin current on one side of the magnetic layer, with spins that are aligned with magnetization direction of the magnetic layer, and a reflected spin current on the other side of the magnetic layer, with spins that are anti-parallel to the magnetization direction of the magnetic layer. This effect occurs upon application of a current to any magnetic layer, including an in-plane polarization layer or an out-of-plane reference magnetic layer. Thus, in a typical MTJ, when switching the magnetization direction of the free layer in one direction (e.g., from the parallel to anti-parallel state) is achieved using spin transfer torque from the transverse spin current, switching the free layer in the other direction (e.g., from the anti-parallel to parallel states) would be achieved using spin transfer torque from the reflected spin current. This is typically accomplished by running electrical current through the MTJ in one direction when switching from the anti-parallel to parallel state and running the electrical current through the MTJ in the other direction when switching from the parallel to anti-parallel state.

FIG. 1 illustrates a magnetic tunnel junction ("MTJ") stack 100 for a conventional MRAM device. As shown, stack 100 includes one or more seed layers 110 provided at the bottom of stack 100 to initiate a desired crystalline growth in the above-deposited layers. Furthermore, MTJ 130 is deposited on top of SAF layer 120. MTJ 130 includes reference layer 132, which is a magnetic layer, a non-magnetic tunneling barrier layer (i.e., the insulator) 134, and the free layer 136, which is also a magnetic layer. It should be understood that reference layer 132 is also part of SAF layer 120. As shown in FIG. 1, magnetic reference layer 132 has a magnetization direction perpendicular to its plane. As also seen in FIG. 1, free layer 136 also has a magnetization direction perpendicular to its plane, but its direction can vary by 180 degrees.

The first magnetic layer 114 in the SAF layer 120 is disposed over seed layer 110. SAF layer 120 also has an antiferromagnetic coupling layer 116 disposed over the first magnetic layer 114. Furthermore, a nonmagnetic spacer 140 is disposed on top of MTJ 130 and a polarizer 150 is disposed on top of the nonmagnetic spacer 140. Polarizer 150 is a magnetic layer that has a magnetic direction in its plane, but is perpendicular to the magnetic direction of the reference layer 132 and free layer 136. Polarizer 150 is provided to polarize a current of electrons ("spin-aligned electrons") applied to MTJ structure 100. Further, one or more capping layers 160 can be provided on top of polarizer 150 to protect the layers below on MTJ stack 100. Finally, a hard mask 170 is deposited over capping layers 160 and is provided to pattern the underlying layers of the MTJ structure 100, using a reactive ion etch (RIE) process.

In all prior MTJ devices using a polarizer such as polarizer 150, the magnetization direction of polarizer 150 is fixed, which is shown in FIGS. 1 and 3. See also U.S. Pat. No. 6,532,164, which states that the direction of the magnetization of the polarizing layer cannot vary in the presence of current. Prior to current passing through the MTJ, the free layer 136 has a magnetization direction 200 perpendicular to that of the polarizer 150. While the magnetization direction 200 of the free layer 136 can rotate by 180 degrees, such rotation is normally precluded by the free layer's inherent damping ability 205, which is represented by a vector 205 pointing to axis 202 (shown as a dashed line in FIG. 2a as well as FIG. 3). Axis 202 is perpendicular to the plane of free layer 136. This damping 205 has value, defined by the damping constant, which maintains the magnetization direction of the free layer 136.

Passing a current through polarizer 150 produces a spin-polarized current, which creates a spin transfer torque 210 in the direction of the polarizer 150 on the magnetization vector 200. This spin transfer torque from the polarizer adds to the main spin transfer torque that causes free layer magnetization direction switching. In devices like those shown in FIG. 1, when the spin transfer torque 210 begins to help overcome the damping 205 inherent to the free layer 136, the magnetic direction 200' begins to precess about its axis, as shown in FIG. 2a. As seen in FIG. 3, spin transfer torque 210 helps the magnetization direction of the free layer 136 to precess in a cone-like manner around an axis 202 perpendicular to the plane of the layers. When a spin polarized current traverses the stack 100, the magnetization of the free layer 136 precesses in a continuous manner (i.e., it turns on itself in a continuous manner as shown in FIG. 3) with maintained oscillations until the magnetic direction of free layer 136 is opposite the magnetic direction prior to the spin torque causing precession, i.e., the magnetic direction of free layer 136 switches by 180 degrees.

In the absence of polarizer 150, random thermal events are required to induce precession of the free layer. In such simple perpendicular MTJ devices, the spin current is only generated by the reference layer 132. Therefore, the spin-polarized electrons generally have a direction that is perpendicular to the plane of the free layer 136 (i.e., aligned parallel with the magnetization vector of the reference layer 132 when the transverse spin current is used to switch the free layer 136 and aligned anti-parallel to the magnetization vector of the reference layer 132 when the reflected spin current is used to switch the free layer 136). However, because both stable directions of the magnetization vector of the free layer 136 are also perpendicular to the plane, spin-polarized electrons with such a perpendicular alignment exert no net spin transfer torque on the free layer 136. Only when the magnetization vector of free layer 136 deviates from a purely perpendicular orientation can the spin current exert a spin transfer torque on the free layer 136. Therefore, in simple perpendicular MTJ systems that lack an in-plane polarizer, random thermal events are required to shift the magnetization vector of the free layer 136 off of the perpendicular axis so that the spin-polarized current generated by the reference layer 132 can exert a spin transfer torque on the free layer 136, thereby switching it from the first magnetization direction to the second.

The use of an in-plane polarizer, such as polarizer 150, can enhance the efficiency of switching free layer 136 by initiating the precession of free layer 136. FIG. 3 illustrates precession of free layer 136 of an MTJ assisted by spin polarized current provided by polarizing magnetic layer 150. The spin polarized electrons from polarizer 150 provide torque 210 that helps overcome the damping 205 in the first half of the precession 215 because the torque 210 provided by the spin polarized current is opposite that of the inherent damping 205 of the free layer 136. This is shown on the right-hand side of the middle portion of FIG. 3. Thus, in-plane polarizer 150 allows the generation of instant spin transfer torque on the free layer 136 upon the application of an electrical current to the MTJ stack 100. The in-plane polarizer contributes an in-plane (i.e., orthogonal) spin torque that can immediately act on the magnetization vector of the free layer, opposing damping 205 and pulling the vector 200 off of the perpendicular plane. This, in turn, allows the perpendicular component of the spin transfer torque to act on the magnetization vector of the free layer 136, thereby obviating the need for the random thermal event described above. In this way, the orthogonal polarizer can enhance the efficiency of switching the free layer.

However, while the use of a perpendicular MTJ with an orthogonal polarizer may increase the efficiency of switching the free layer, such structures might also suffer from a concomitant reduction in thermal stability. Particularly in smaller devices, the effective magnetization of the free layer is reduced, thereby allowing switching of the free layer to occur at the low currents needed for commercial applicability. The presence of an orthogonal polarizer can further destabilize the free magnetic layer due to magnetic and/or electronic effects potentially leading to an increased probability for random, unintended switching, particularly during application of the read current to the device (i.e., read disturb). This higher probability of random switching and read disturb can limit the commercial applicability of the device, leading to a shorter duration of memory retention and reduced thermal stability.

Thus, in prior devices, because magnetization direction of in-plane polarizer 150 is fixed, structures utilizing such a polarizer suffer from an increased probability of read disturb or other unintended switching of the free layer. This, in turn, reduces the commercial applicability of such devices due to reduced durations of memory storage and impaired thermal stability. Such deleterious attributions are in part the result of the fact that the polarizer 150 continues to destabilize the free layer in the absence of the electrical current used to write the bit (i.e., the programming current).

Thus, there is a need for a spin torque transfer device that reduces the amount of current needed for switching while also switching at high speeds and requiring reduced chip area. Such device should also be stable during the when reading the bit and during periods of inactivity.

SUMMARY

An MRAM device is disclosed that has a magnetic tunnel junction stack having a significantly improved performance of the free layer in the magnetic tunnel junction structure that requires significantly lower switching currents and which significantly reduces switching times for MRAM applications. This device is also capable of achieving reduced read disturb rates and greater thermal stability.

In one embodiment, a magnetic device includes a magnetic tunnel junction (MTJ). The MTJ comprises a reference magnetic layer in a first plane, a non-magnetic tunnel barrier layer in a second plane, and a free magnetic layer in a third plane. The free magnetic layer and the reference magnetic layer are separated by the non-magnetic tunnel barrier layer.

The free magnetic layer has a magnetization vector that is perpendicular to the third plane and which precesses from a first perpendicular magnetization direction to a second perpendicular magnetization direction when a programming current passes there through. The first perpendicular magnetization direction is opposite the second perpendicular magnetization direction. The magnetic reference layer has a magnetization vector that is perpendicular to the first plane and has a fixed magnetization direction. The magnetic device also includes a non-magnetic spacer layer in a fourth plane and disposed over the free magnetic layer. The magnetic device also includes a polarizer magnetic layer in a fifth plane and disposed over the non-magnetic spacer layer. The polarizer magnetic layer has a programming magnetization direction and a stabilizing magnetization direction. The programming magnetization direction is in the fifth plane and the stabilizing magnetization direction is perpendicular to the fifth plane. The magnetization direction of the polarizer magnetic layer is in the programming magnetization direction when the programming current is passed through the magnetic device. The magnetization direction of the polarizer magnetic layer is in the stabilizing magnetization direction when no programming current is passed through the magnetic device.

In another embodiment, the polarizer magnetic layer comprises Co, Fe, FeB, FeV, or CoFeB.

In another embodiment, the reference magnetic layer CoFeB.

In another embodiment, the free magnetic layer comprises CoFeB.

In another embodiment, the polarizer magnetic layer comprises CoFeB.

In another embodiment, the non-magnetic spacer layer comprises MgO.

In another embodiment, the non-magnetic tunnel barrier layer comprises MgO.

In another embodiment, the magnetization vector of the polarizer magnetic layer is switched from the stabilizing magnetization direction to the programming direction by the programming current.

In another embodiment, the magnetization vector of the free magnetic layer is coupled to the magnetization vector of the polarizer magnetic layer via dipolar coupling in the absence of the programming current.

In another embodiment, the polarizer magnetic layer has a $M_{eff}$ value that is nearly zero kOe.

In another embodiment, a magnetic device includes a magnetic tunnel junction (MTJ). The MTJ comprises a reference magnetic layer in a first plane, a non-magnetic tunnel barrier layer in a second plane, and a free magnetic layer in a third plane. The free magnetic layer and the reference magnetic layer are separated by the non-magnetic tunnel barrier layer. The free magnetic layer has a magnetization vector that is perpendicular to the third plane and which precesses from a first perpendicular magnetization direction to a second perpendicular magnetization direction when a programming current passes there through. The first perpendicular magnetization direction is opposite the second perpendicular magnetization direction. The magnetic reference layer has a magnetization vector that is perpendicular to the first plane and has a fixed magnetization direction. The magnetic device also includes a non-magnetic spacer layer in a fourth plane and disposed over the free magnetic layer. The magnetic device also includes a polarizer magnetic layer in a fifth plane and disposed over the non-magnetic spacer layer. The polarizer magnetic layer has a programming magnetization direction and a stabilizing magnetization direction. The programming magnetization direction is in the fifth plane and the stabilizing magnetization direction is perpendicular to the fifth plane. The magnetic device also includes a spin diffusive spacer layer in a sixth plane and disposed over the polarizer magnetic layer. The magnetic device also includes an orthogonal magnetic layer in a seventh plane. The orthogonal magnetic layer is separated from the polarizer magnetic layer from the spin diffusive spacer layer. The orthogonal magnetic layer has a magnetization direction that has a substantial magnetization component in the seventh plane. The magnetization direction of the polarizer magnetic layer is in the programming magnetization direction when the programming current is passed through the magnetic device. The magnetization direction of the polarizer magnetic layer is in the stabilizing magnetization direction when no programming current is passed through the magnetic device.

In another embodiment, the orthogonal magnetic layer comprises Co, Fe, FeB, FeV, or CoFeB.

In another embodiment, the orthogonal magnetic layer comprises CoFeB.

In another embodiment, the magnetization direction of the orthogonal magnetic layer is fixed.

In another embodiment, the orthogonal magnetic layer is part of an in-plane synthetic antiferromagnet (SAF) structure. The in-plane SAF structure comprises a first in-plane SAF magnetic layer and a second in-plane SAF magnetic layer separated by a nonmagnetic in-plane SAF spacer layer. The first in-plane SAF magnetic layer has a magnetization vector parallel to the seventh plane. The second in-plane SAF magnetic layer has a magnetization vector parallel to the seventh plane. The non-magnetic in-plane SAF spacer layer enables antiferromagnetic coupling between the first in-plane SAF magnetic layer and the second in-plane SAF magnetic layer.

In another embodiment, the first in-plane SAF magnetic layer comprises Co, the non-magnetic in-plane SAF spacer layer comprises Ru, and the second in-plane SAF magnetic layer comprises Co.

In another embodiment, a magnetic device includes a magnetic device includes a magnetic tunnel junction (MTJ). The MTJ comprises a reference magnetic layer in a first plane, a non-magnetic tunnel barrier layer in a second plane, and a free magnetic layer in a third plane. The free magnetic layer and the reference magnetic layer are separated by the non-magnetic tunnel barrier layer. The free magnetic layer has a magnetization vector that is perpendicular to the third plane and which precesses from a first perpendicular magnetization direction to a second perpendicular magnetization direction when a programming current passes there through. The first perpendicular magnetization direction is opposite the second perpendicular magnetization direction. The magnetic reference layer has a magnetization vector that is perpendicular to the first plane and has a fixed magnetization direction. The magnetic device also includes a non-magnetic spacer layer in a fourth plane and disposed over the free magnetic layer. The magnetic device also includes a polarizer magnetic layer in a fifth plane. The polarizer magnetic layer and the MTJ are separated by the non-magnetic spacer. The polarizer magnetic layer has a stabilizing magnetization direction perpendicular to the fifth plane. The polarizer magnetic layer has a programming magnetization direction. The programming magnetization direction has a magnetization component in the fifth plane. The magnetic device also includes a spin diffusive spacer layer in a sixth plane. The magnetic device also includes an orthogonal magnetic layer in a seventh plane. The orthogonal magnetic layer and the polarizer magnetic layer are separated by the spin diffusive spacer layer. The orthogonal magnetic layer has a magnetization direction that has a substantial magnetization component in the seventh plane. The magnetization direction of the polarizer magnetic layer is in the stabilizing magnetization direction in the absence of the programming current.

BRIEF DESCRIPTION OF THE DRAWINGS

The accompanying drawings, which are included as part of the present specification, illustrate the presently preferred embodiments and, together with the general description given above and the detailed description given below, serve to explain and teach the principles of the MTJ devices described herein.

FIGS. 2a-2b illustrates the precession of the free layer in an MTJ.

FIG. 3 illustrates the precession of the free layer in an MTJ used with a polarizing magnetic layer having a fixed magnetization direction.

FIGS. 4a-4d illustrate the switching process for an MRAM device having a polarizer layer with a magnetization vector that can adopt a programming magnetization direction or a stabilizing magnetization direction.

Figure 1:
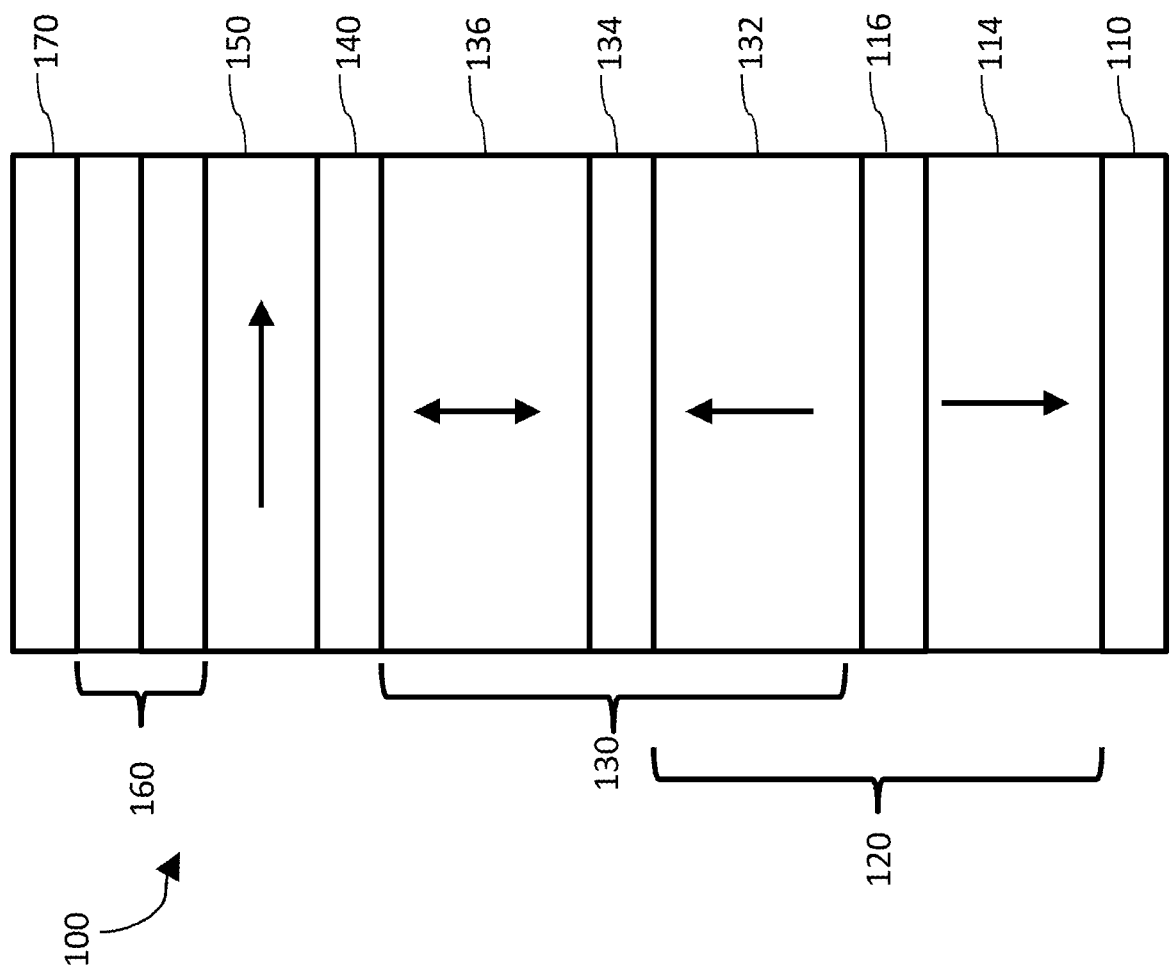
FIG. 1 illustrates a conventional MTJ stack for an MRAM device.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

The following description is presented to enable any person skilled in the art to create and use a MTJ device comprising an adjustable polarizer and utilize a method for enhanced switching of a high stability MRAM device. Each of the features and teachings disclosed herein can be utilized separately or in conjunction with other features to implement the disclosed system and method. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present teachings. However, it will be apparent to one skilled in the art that these specific details are not required to practice the present teachings.

This present patent document discloses a MRAM device that utilizes a polarizer layer that has a magnetization vector that can adopt a programming magnetization direction or a stabilizing magnetization direction. The magnetization vector of the polarizer layer is dipole-coupled to the magnetization vector of the free layer. In the absence of an electrical current of sufficient current strength (i.e., a programming current), the magnetization vector of the polarizer layer is in the stabilizing direction, which is perpendicular to the plane of the polarizer layer and aligned with the magnetization vector of the free layer. Moreover, when magnetization vector of the polarizer layer is in the stabilizing direction, the magnetization vector of the polarizer layer and the magnetization vector of the free layer are alignment-locked, thereby stabilizing the free layer. In the presence of the programming current, the magnetization vector of the polarizer layer adopts the programming direction, which in some embodiments is parallel to the plane of the polarizer layer. Switching of the magnetization vector of the polarizer layer to the programming direction breaks the alignment locking between the polarizer layer and the free layer. When the magnetization vector of the polarizer layer is in the programming direction, the stray field from the polarizer layer serves to destabilize the free layer, concomitantly reducing the strength of the current necessary to switch the magnetization direction of the free layer. In addition, when the magnetic vector of the polarizer layer is in the programming direction, application of a programming current generates a spin current that exerts a spin transfer torque on the free layer. The spin transfer torque comprises an in-plane component, thereby enhancing the efficiency of switching the free layer.

This present patent document also discloses a MRAM device that utilizes an orthogonal magnetic layer and a polarizer layer that has a magnetization vector that can adopt a programming magnetization direction or a stabilizing magnetization direction. The orthogonal magnetic layer has a magnetization direction that has a substantial magnetization component in the plane of the orthogonal magnetic layer (i.e., parallel or nearly parallel to the orthogonal magnetic layer). The magnetization vector of polarizer layer is dipole-coupled to the magnetization vector of the free layer. In the absence of an external stimulus, e.g. an electrical current of sufficient current strength (i.e., a programming current) or a spin current of sufficient strength, the magnetization vector of the polarizer layer is in the stabilizing direction, which is perpendicular to the plane of the polarizer layer and aligned with the magnetization vector of the free layer. Moreover, when magnetization vector of the polarizer layer is in the stabilizing direction, the magnetization vector of the polarizer layer and the magnetization vector of the free layer are alignment-locked, thereby stabilizing the free layer. In the presence of the programming current, the magnetic layer generates a spin-polarized current that exerts a spin transfer torque on the magnetization vector of the polarizer layer. The magnetization vector of the polarizer layer is then switched to the programming direction, which in some embodiments is parallel to the plane of the polarizer layer. Switching of the magnetization vector of the polarizer layer to the programming direction breaks the alignment locking between the polarizer layer and the free layer. When the magnetization vector of the polarizer layer is in the programming direction, the stray field from the polarizer layer serves to destabilize the free layer, concomitantly reducing the strength of the current necessary to switch the magnetization direction of the free layer. Moreover, when the magnetic vector of the polarizer layer is in the programming direction, it can generate a spin current that exerts a spin transfer torque on the free layer that includes an in-plane component, thereby enhancing the efficiency of switching the free layer.

FIG. 4 shows the concept behind the MRAM device using a polarizer layer that has a magnetization vector that can adopt a programming magnetization direction or a stabilizing magnetization direction. The magnetization vector of the polarizer layer is dipole-coupled to the magnetization vector of the free layer. In the absence of an external stimulus, such as an electric current or a spin current applied to MTJ stack 300, the magnetic vector of polarizer 350 is in the stabilizing magnetic direction and is alignment-locked with free layer 336. This can be seen in FIG. 4a, with the field lines 400 depicting the alignment locking between the free layer 336 and polarizer 350. This alignment locking of the polarizer 350 and the free layer 336 increases the stability of the MTJ structure. More energy must therefore be applied to the system to switch the magnetization vector of the free layer. Therefore, this stabilization significantly reduces the probability that stochastic thermal events will lead to inadvertent switching of the free layer 336. As a result, the various embodiments disclosed herein exhibit enhanced stability and increased duration of memory retention.

However, in the presence of an external stimulus, the magnetization vector of polarizer 350 can be switched from the stabilizing direction to a programming direction that is no longer alignment-locked with the magnetization vector of free layer 336. In the embodiment depicted in FIG. 4b, the polarizer 350 adopts a programming direction that is fully in the plane of the polarizer layer and perpendicular to the magnetization vector of free layer 336. In other embodiments, the programming magnetization direction of polarizer 350 is not fully in plane, but has a magnetization vector that has a substantial in-plane component. In other embodiments, the magnetization vector of polarizer 350 does not adopt a particular discernable programming direction, but nevertheless becomes dislodged from the stabilizing magnetization direction upon exposure to an external stimulus. In each of these embodiments, the stray field from the polarizer layer 336 destabilizes the free layer 336 when the polarizer layer 336 is in the programming state.

Switching of the polarizer 350 out of the stabilizing magnetization direction disrupts the perpendicular dipole coupling between the magnetization vectors of free layer 336 and polarizer 350. The free layer 336 is no longer stabilized in the perpendicular position by this perpendicular dipole coupling. In addition, the stray field from the in-plane component of the polarizer layer serves to destabilize the free layer 336, making it easier to switch the magnetization direction of the free layer 336. The free layer 336 can now be switched more efficiently. Thus, switching the polarizer 350 out of the stabilizing magnetization direction primes the free layer 336 for switching.

Moreover, when the polarizer 350 adopts a programming magnetization direction that has a substantial in-plane component (e.g., the fully in-plane direction depicted in FIG. 4b), the polarizer can contribute in-plane spin transfer torque (i.e., orthogonal spin torque) on the free layer in the presence of an electric current applied to the MTJ (i.e., the programming current). As discussed above, orthogonal spin transfer torque, such as that generated by an in-plane polarizer, can enhance the efficiency of switching free layer 336. Orthogonal spin transfer torque pulls the magnetization vector of the free layer 336 out of a purely perpendicular state (i.e., the first perpendicular magnetization direction), allowing the orthogonal spin transfer torque to act on the magnetization vector of free layer 336, thereby leading to switching of free layer 336. The orthogonal spin torque bypasses the need for a stochastic thermal event to dislodge the magnetization vector of the free layer 336 from the first perpendicular magnetization direction. Thus, magnetic device 300 can achieve rapid switching of free layer 336 when the polarizer 350 has a magnetization vector with a substantial in-plane component (i.e., is in the programming direction).

In one embodiment, the polarizer 350 can adopt a stabilizing magnetic direction that is perpendicular to the plane of the polarizer 350 and a programming magnetic direction that is parallel to the plane of the polarizer 350. In other embodiments, the polarizer 350 can adopt a stabilizing magnetic direction that is perpendicular to the plane of the polarizer 350 and a programming magnetic direction that has a substantial magnetization component parallel to the plane of the polarizer 350. In other embodiments, the polarizer 350 can adopt a stabilizing magnetic direction that is perpendicular to the plane of the polarizer 350 and a programming state with an undefined magnetization direction having a substantial magnetization component in the plane of the polarizer 350. In some embodiments, the polarizer 350 is in the stabilizing (i.e., perpendicular) magnetization direction in the absence of an external stimulus. In some embodiments, the magnetization vector of the polarizer 350 switches to the programming magnetization direction upon exposure to an external stimulus. In some embodiments, the external stimulus can be an electrical current (i.e., a programming current). In some embodiments, the external stimulus is applied to the entire MTJ structure. In some embodiments, the external stimulus is applied to an area comprising the polarizer 350.

Figure 5:
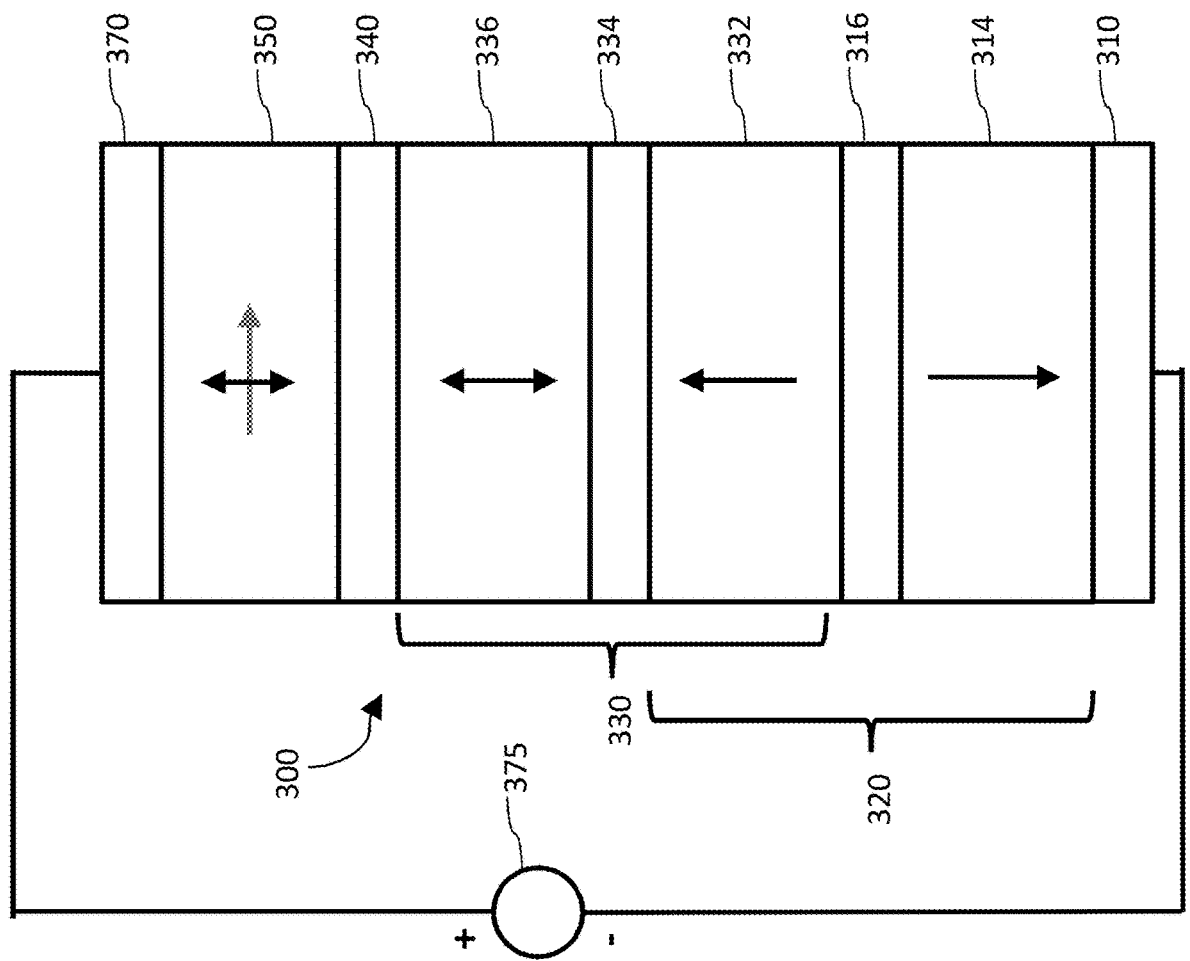
FIG. 5 illustrates an MTJ stack for an MRAM device having a polarizer layer with a magnetization vector that can adopt a programming magnetization direction or a stabilizing magnetization direction.

A memory cell with a perpendicular MTJ and a polarizer layer that has a magnetization vector capable of adopting a programming direction and a stabilizing direction is shown in FIG. 5. MTJ structure 300 includes one or more seed layers 310 provided at the bottom of stack 300 to initiate a desired crystalline growth in the above-deposited layers. Synthetic antiferromagnetic (SAF) layer 320 is disposed over seed layer 310. SAF layer 320 is comprised of a first SAF layer 332, anti-ferromagnetic coupling layer 316 and second SAF layer 314. Second SAF layer 314 is deposited over seed layer 310, while anti-ferromagnetic coupling layer 316 is placed over second SAF layer 314. MTJ 330 is deposited over anti-ferromagnetic coupling layer 316. MTJ 330 includes first SAF layer 332, which acts as the reference layer of the MTJ, and is also part of SAF layer 320. A tunneling barrier layer (i.e., the insulator) 334 is disposed over first SAF layer 332 while the free layer 336 is disposed over tunneling barrier layer 334. As shown in FIG. 5, the magnetization vector of first SAF layer 332 has a magnetization direction that is preferably perpendicular to its plane, although variations of a several degrees are within the scope of what is considered perpendicular. As also seen in FIG. 5, free layer 336 has a magnetization vector that is preferably perpendicular to its plane, but its direction can vary by 180 degrees (i.e., from the first perpendicular magnetization direction to the second perpendicular magnetization direction). Free layer 336 has a magnetization direction that is preferably perpendicular to its plane, although variations of a several degrees are within the scope of what is considered perpendicular. A nonmagnetic spacer 340 is disposed over MTJ 330. Polarizer magnetic layer 350 is disposed over nonmagnetic spacer 340. In one embodiment, polarizer magnetic layer 350 has a magnetization vector that can be oriented either perpendicular to the plane (i.e., the stabilizing direction) or parallel to the plane (i.e., the programming direction). Polarizer 350 has a magnetization direction that can be preferably perpendicular to its plane, although variations of a several degrees are within the scope of what is considered perpendicular. In addition, polarizer 350 has a magnetization direction that can be preferably parallel to its plane, although variations of a several degrees are within the scope of what is considered parallel. One or more capping layers 370 can be provided on top of polarizer magnetic layer 350 to protect the layers below on MTJ stack 300.

Nonmagnetic spacer 340 has a number of properties. For example, nonmagnetic spacer 340 physically separates the free layer 336 and the polarizer layer 350. Nonmagnetic spacer 340 promotes magnetic and/or electronic coupling of the polarizer magnetic layer 350 with the free layer 336. The nonmagnetic spacer 340 maintains coupling between the polarizer 350 and free layer 336 such that the magnetization vectors of polarizer 350 and free layer 336 are alignment-locked when the magnetization vector of polarizer layer 350 is in the stabilizing direction (i.e., perpendicular to the plane), thereby stabilizing the free layer 336. However, non-magnetic spacer 340 also maintains the coupling between the polarizer layer 350 and the free layer 332 such that the magnetization vector of the polarizer layer can switch to the programming direction (i.e., parallel to the plane) in the presence of an external stimulus, e.g., a sufficiently strong current (i.e., programming current). Nonmagnetic spacer 340 transmits spin current efficiently from the polarizer magnetic layer 350 into the free layer 336 because it preferably has a long spin diffusion length. Nonmagnetic spacer 340 also promotes good microstructure and high tunneling magnetoresistance (TMR) and helps keep the damping constant of the free layer 336 low.

Polarizer magnetic layer 350 has at least the following properties. First, in one embodiment, the magnetization vector of polarizer magnetic layer 350 can adopt at least two magnetic directions: (1) a stabilizing magnetic direction, which is perpendicular to the plane of the layer and aligned with the magnetic direction of the free layer; and (2) a programming magnetic direction, which, in one embodiment, is in the plane of the layer and perpendicular to magnetization direction of free layer 336. In one embodiment, the MTJ stack is more stable when the magnetization vector of polarizer magnetic layer 350 is in the stabilizing direction and alignment-locked to the magnetization vector of free layer 336. Thus, in the absence of an external stimulus, such as an electrical current of sufficient strength (i.e., the programming current) the polarizer magnetic layer 350 remains in the stabilizing direction (i.e., aligned with free layer 336). However, in the presence of particular stimuli, such as the programming current, the magnetization vector of polarizer magnetic layer 350 can adopt the programming direction, thereby breaking the alignment-locking with free layer 336. In other embodiments, the programming direction has a substantial in-plane component, but is not entirely in the plane of polarizer layer 350. In other embodiments, the magnetization vector does one adopt one particular direction upon application of the external stimulus, but rather adopts a programming state which may include one or more magnetization directions that have a substantial magnetization component parallel to the polarizer layer 350. In each of these embodiments, the stray field from the polarizer layer 350 can destabilize the magnetization vector of the free layer 336, thereby priming the free layer for switching.

In a preferred embodiment, polarizer layer 350 preferably has a $M_{eff}$ value that is nearly zero kOe, making it easier for the external stimulus to change the magnetic direction of polarizer layer 350. The effective anisotropy of magnetic thin films can be defined as $4\pi M_{eff} = H_{demag} - H_{k\perp}$, where $H_{demag} = 4\pi M_s$ at full film (planar limit) and is reduced by a shape factor when the film is patterned into a disk. $H_{k\perp}$ is the perpendicular magnetic anisotropy (PMA) at the top and bottom surfaces of the magnetic film. The effective anisotropy, $4\pi M_{eff}$ (which we will refer to as $M_{eff}$ for brevity), can be viewed as the competition between the bulk demagnetization property of the film that acts to keep the magnetization in the plane of the film ($M_{eff} > 0$), and the surface anisotropy component that acts to orient the magnetization perpendicular to the surface ($M_{eff} < 0$). In embodiments where polarizer layer 350 preferably has a $M_{eff}$ value that is nearly zero kOe, less energy will be required to change the magnetic direction of the polarizer layer 350 from the stabilizing magnetization direction to the programming magnetization direction. This will offer a number of benefits, including reduced power consumption and increased long-term stability. In some preferred embodiments, polarizer layer 350 preferably has a $M_{eff}$ value that is between 0 and 600 Oe. In other preferred embodiments, polarizer layer 350 preferably has a $M_{eff}$ value that is between 0 and 400 Oe. In yet other preferred embodiments, polarizer layer 350 has a $M_{eff}$ value that is between 0 and 200 Oe. In some preferred embodiments, polarizer layer 350 has a $M_{eff}$ value that is between 0 and 100 Oe.

Figure 6:
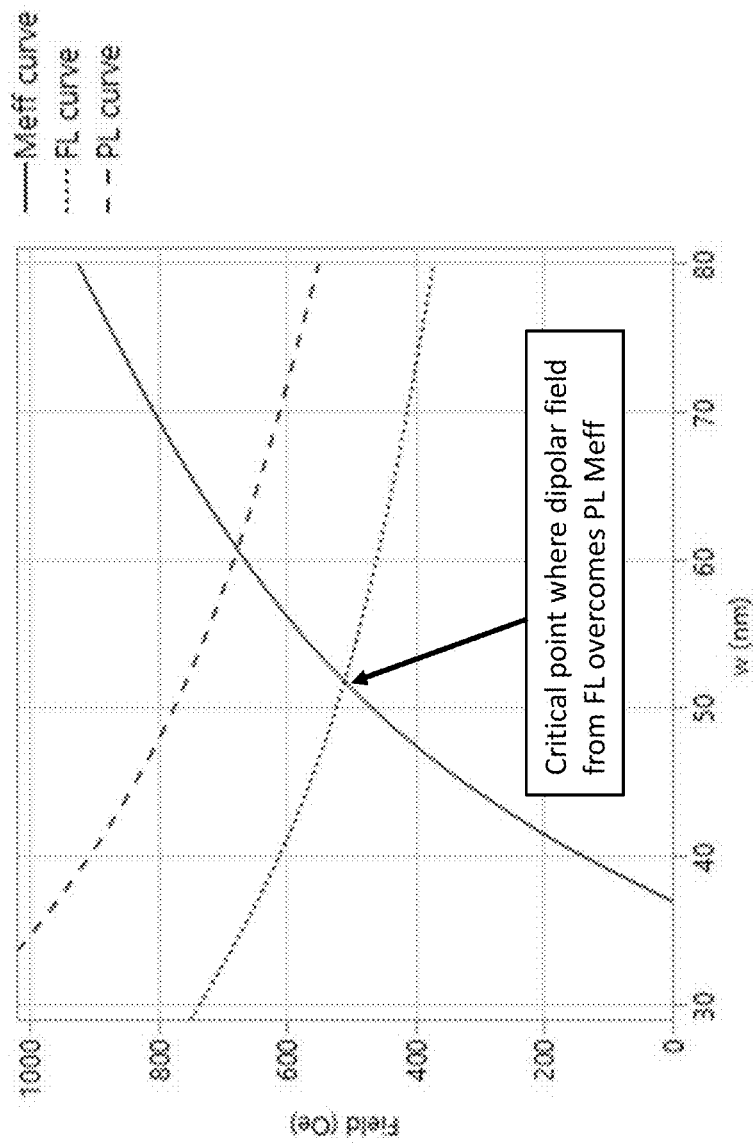
FIG. 6 shows a graph that depicts the magnetic strength of the $M_{eff}$ of the polarizer layer, the stray field of the polarizer layer, and the stray field of the free layer of MRAM devices having a range of sizes.

FIG. 6 is a graph that depicts the effect that the width of the MTJ stack has on magnetization properties of free layer 336 and polarizer layer 350. FIG. 6 assumes particular magnetic properties for each of the magnetic layers and thus represents one particular embodiment. The orientation of the curves in FIG. 6 can change for different embodiments that comprise magnetic layers with different magnetic properties. The X axis is the width of the MTJ stack in nanometers (nm). The Y axis represents magnetic field strength in oersteds (Oe). The line labeled "PL curve" is the dipolar stray field that, in the one particular embodiment described by FIG. 6, polarizer layer 350 exerts on free layer 336 when polarizer layer 350 is aligned with free layer 336. This is the stabilization field. The line labeled "FL curve" is the dipolar stray field that in a particular embodiment free layer 336 exerts on polarizer layer 350. This is the field that forces polarizer layer 350 into alignment with free layer 336. The line labelled "$M_{eff}$ curve" is the $M_{eff}$ of the polarizer layer 350, assuming in a particular embodiment a constant PMA and a demagnetization term that scales with size. For MTJ stacks with larger widths, the $M_{eff}$ of polarizer layer 350 is positive and the magnetization vector of polarizer layer 350 is constrained into the plane.

The size at which the FL curve and the line labeled $M_{eff}$ curve intersect is the size at which the dipolar stray field from free layer 336 overcomes the effective anisotropy field that constrains the magnetization vector of polarizer layer 350 into the plane. Below this size the magnetization vector of polarizer layer 350 will align with the direction of the dipolar stray field of free layer 336, thereby achieving perpendicular dipolar coupling with the magnetization vector of free layer 336.

Thus, before the MTJ stack is patterned into bits for MRAM, the magnetization vector of the polarizer layer 350 is in-plane at full-film, with a PMA reduction of the demagnetization field to achieve an $M_{eff}$ value of roughly 1 kOe for the polarizer layer 350. Both the PMA and the demagnetization field are dependent in part on the composition and thickness of polarizer layer 350. The PMA is also controlled by the thickness and composition of the capping layer and the nature of the interface between the polarizer layer 350 and the spacer layer 340. After the MTJ stack is patterned into bits for MRAM, reducing the width of the MTJ stacks, the reduced demagnetization field of the polarizer layer 350 results in further reduction of $M_{eff}$ to nearly zero. This can be seen in FIG. 6, depicted by the $M_{eff}$ curve, which illustrates the reduction in the $M_{eff}$ of polarizer layer 350 as the width of the MTJ stack is reduced. At the smaller sizes, the dipolar stray field from free layer 336 easily sets the magnetization vector of polarizer layer 350 to align with the magnetization vector of free layer 336. This results in the perpendicular dipole coupling between the polarizer layer 350 and free layer 336 that enhances the stability of the MTJ stack. There is not necessarily a constraint in size, however, as the strength of the stray fields from the free layer 336 and polarizer layer 350, as well as the $M_{eff}$ and PMA values of the polarizer layer 350, can all be altered by the composition and microstructure of the various layers within the MTJ stack.

The difference between the FL curve and the $M_{eff}$ curve (depicted in FIG. 6) essentially determines how much energy is required to bring the magnetization vector of the polarizer layer 350 in-plane (i.e., switched into the programming magnetization direction). Thus, there is an operational window in size for each MTJ stack having a specific set of layers, each with their own magnetic properties. For instance, for the embodiment depicted by the plot in FIG. 6, one might say that 35 to 45 nm is the operational window. Moreover, it should be understood that all three curves in FIG. 6 depend on the magnetic properties of the free layer 336 and polarizer layer 350. For example, the $M_{eff}$ curve can be altered to target smaller sizes for instance by reducing the partial PMA of the polarizer layer 350. Such PMA reduction can be achieved, for example, by increasing the thickness of the polarizer layer 350. This reduction in PMA shifts the $M_{eff}$ curve upwards, thereby shifting the operating window to smaller sizes. In some preferred embodiments, the width of the MTJ stack is preferably between 10 and 80 nm. In other preferred embodiments, the width of the MTJ stack is preferably between 20 and 60 nm. In yet other preferred embodiments, the width of the MTJ stack is preferably between 30 and 50 nm.

Seed layer 310 in the MTJ structure shown in FIG. 5 preferably comprises Ta, TaN, Cr, Cu, CuN, Ni, Fe or alloys thereof. Second SAF layer 314 preferably comprises either a Co/Ni or Co/Pt multilayer structure. First SAF layer 332 preferably comprises either a Co/Ni or Co/Pt multilayer structure plus a thin non-magnetic layer comprised of tantalum having a thickness of two to five Angstroms and a thin CoFeB layer (0.5 to three nanometers). Anti-ferromagnetic coupling layer 316 is preferably made from Ru having thickness in the range of three to ten Angstroms. Tunneling barrier layer 334 is preferably made of an insulating material such as MgO, with a thickness of approximately ten Angstroms. Free layer 336 is preferably made with CoFeB deposited on top of tunneling barrier layer 334. Free layer 336 can also have layers of Fe, Co, Ni or alloys thereof. Spacer layer 340 over MTJ 330 can be any non-magnetic material such as 2 to 20 Angstroms of ruthenium, 2-20 Angstroms of Ta, 2-20 Angstroms of TaN, 2-20 Angstroms of Cu, 2-20 Angstroms of CuN, or 2-20 Angstroms MgO layer. Spacer layer 340 is preferably made from MgO.

Polarizer magnetic layer 350 is preferably made from CoFeB. It can also be made with Co, Fe, Ni magnetic layers or can be made out of their alloys. The magnetic alloys can also have boron, tantalum, copper or other materials. Finally, capping layer 370 can be any material that provides a good interface to the polarizer magnetic layer such as Ta, TaN, Ru, MgO, Cu, etc.

The manner in which a bit is written using MTJ structure 300 having polarizer layer 350 will now be described. The magnetization vectors of the free layer 336 and the polarizer 350 are dipole-coupled. Before application of an external stimulus (e.g., the programming current), the magnetization vectors of free layer 336 and polarizer 350 are alignment-locked. As seen in FIG. 4a, the free layer 336 has a magnetization direction that is perpendicular to its plane and facing upwards (i.e., in the first perpendicular magnetic direction). The magnetic vector of polarizer 350 is in the stabilizing magnetic direction, which is aligned with the free layer 336. Stray fields from the free layer 336 act on the magnetization vector of polarizer layer 350 to keep the magnetization vector of the polarizer layer 350 in the stabilizing direction. The perpendicular magnetic and/or electronic coupling between polarizer 350 and free layer 336 (i.e., the alignment-locking, depicted as field lines 400 in FIG. 4a) stabilizes the magnetization vector of free layer 336, reducing the probability that stochastic fluctuations will lead to unwanted switching of the free layer 336. In addition, this enhanced stability reduces the probability of inadvertently switching free layer 336 when measuring the resistance across the bit (i.e., read disturb). In this way, the device exhibits enhanced memory retention over time.

FIG. 4 depicts the process for switching the free layer of one embodiment of the disclosure described herein. Two distinct magnetic processes occur that lead to writing the bit: first, the magnetization vector of polarizer layer 350 is switched from the stabilizing direction to the programming direction (compare FIG. 4a to FIG. 4b); and second, the magnetization vector of free layer 336 is switched from the first perpendicular direction to the second perpendicular direction (compare FIG. 4b to FIG. 4c). The magnetization vector of polarizer 350 is switched by an external stimulus that influences the orientation of the magnetization vector. In some embodiments, this external stimulus can be an electrical current or a spin current. In some embodiments, the polarizer 350 is switched to the programming direction before a programming current is applied. In other embodiments, the polarizer 350 is switched to the programming direction while the programming current is applied. In some embodiments, the application of the programming current switches the magnetization vector of polarizer 350 from the stabilizing direction to the programming direction.

In the example shown in FIG. 4, the programming current flows through the layers of the device in the following order: (1) the polarizer 350, (2) the non-magnetic spacer 340; (3) the free layer 336, (4) the tunneling barrier layer 334; and (5) the reference layer 332. Application of the programming current to the embodiment depicted in FIG. 4 with the magnetic vector of polarizer 350 in the programming magnetic direction (i.e., the configuration depicted in FIG. 4b) generates a spin-polarized current. When switching the free layer 336 from the first perpendicular magnetic direction to the second perpendicular magnetic direction (as depicted in FIG. 4), this second spin-polarized current is generated in part by the transverse spin current from the polarizer 350 and the reflected spin current from the reference layer 332. Thus, in some embodiments, the second spin-polarized current exerts a spin transfer torque on the free layer 336 having an in-plane component that is aligned with the magnetization direction of the polarizer layer 350. This spin transfer torque causes the magnetization vector of the free layer 336 to be pulled off of its perpendicular alignment towards the equatorial position, thereby initiating the precessional motion depicted in FIG. 3. This, in turn, allows the reflected spin current from the reference layer to exert a spin-transfer torque on the free layer 336 that is anti-parallel to the magnetization direction of the reference layer 336. In this way, the magnetization vector of the free layer is switched from the parallel state (i.e., the first perpendicular magnetization direction) to the anti-parallel state (i.e., the second perpendicular magnetization direction). FIG. 4c shows the free layer switched to the second perpendicular magnetization direction, with the polarizer still in the programming magnetic direction. In some embodiments, the free layer will not be fully perpendicular to the plane (i.e., in the second perpendicular magnetic direction) until the programming current has been terminated.

Finally, after free layer 336 has been switched, application of the programming current to the magnetic device is terminated and no spin-polarized current is generated in the device. In addition, the external stimulus is no longer applied to the polarizer layer 350. In the absence of the external stimulus, the magnetic vector of polarizer 350 once again assumes a perpendicular orientation (i.e., switches to a stabilizing magnetic direction). This occurs spontaneously because the stray fields from the perpendicular free layer 336 interact with the magnetization vector of polarizer layer 350, pushing the magnetization vector of polarizer 350 into a perpendicular orientation (i.e., a stabilizing direction). The magnetization vector of polarizer 350 remains in the stabilizing direction because the stabilizing magnetic direction is the energetically favored (i.e., lower energy) state when the magnetic vector of the free layer 336 is in a perpendicular direction. The enhanced stability is in part the result of perpendicular dipole coupling between the magnetic vectors of the polarizer 350 and the free layer 336. The perpendicular dipole coupling leads to alignment locking between the two magnetization vectors, enhancing the stability of the MTJ structure.

Thus, changing the polarization magnetic layer 350 from the stabilizing magnetic direction to the programming magnetic direction during switching of free layer 336 offers at least two distinct benefits. First, when the magnetization direction of polarizer 350 has a substantial in-plane component (i.e., when it is in the programming direction) free layer 336 is destabilized, thereby rendering the free layer 336 amenable to switching. Second, as described above, the programming magnetic direction of polarizer 350 has a substantial in-plane component. Thus, the polarizer can generate a spin transfer torque on the free layer 336 that has an in-plane component, thereby pushing the magnetic vector of free layer 336 towards the equator and assisting in switching of the free layer 336.

In other embodiments, the magnetization vector of the polarizer 350 does not achieve a fully in-plane magnetic direction and may not even adopt a specific discernable programming magnetic direction. Nevertheless, in these embodiments, when the magnetization vector of polarizer 350 is not in the stabilizing direction, its magnetization direction will have an in-plane component that is sufficient to exert a second spin transfer torque that can switch the magnetization direction of free layer 336. Thus, such embodiments will still offer the benefits described above: the MTJ structure will be stabilized by alignment-locking between free layer 336 and polarizer 350 in the absence of the external stimulus; application of the external stimulus will break this alignment locking, thereby priming the MTJ structure for switching the free layer 336; and when the polarizer 350 is not in the stabilizing direction, sufficient in-plane spin transfer torque will be generated to assist in switching the free layer 336.

Figure 8:
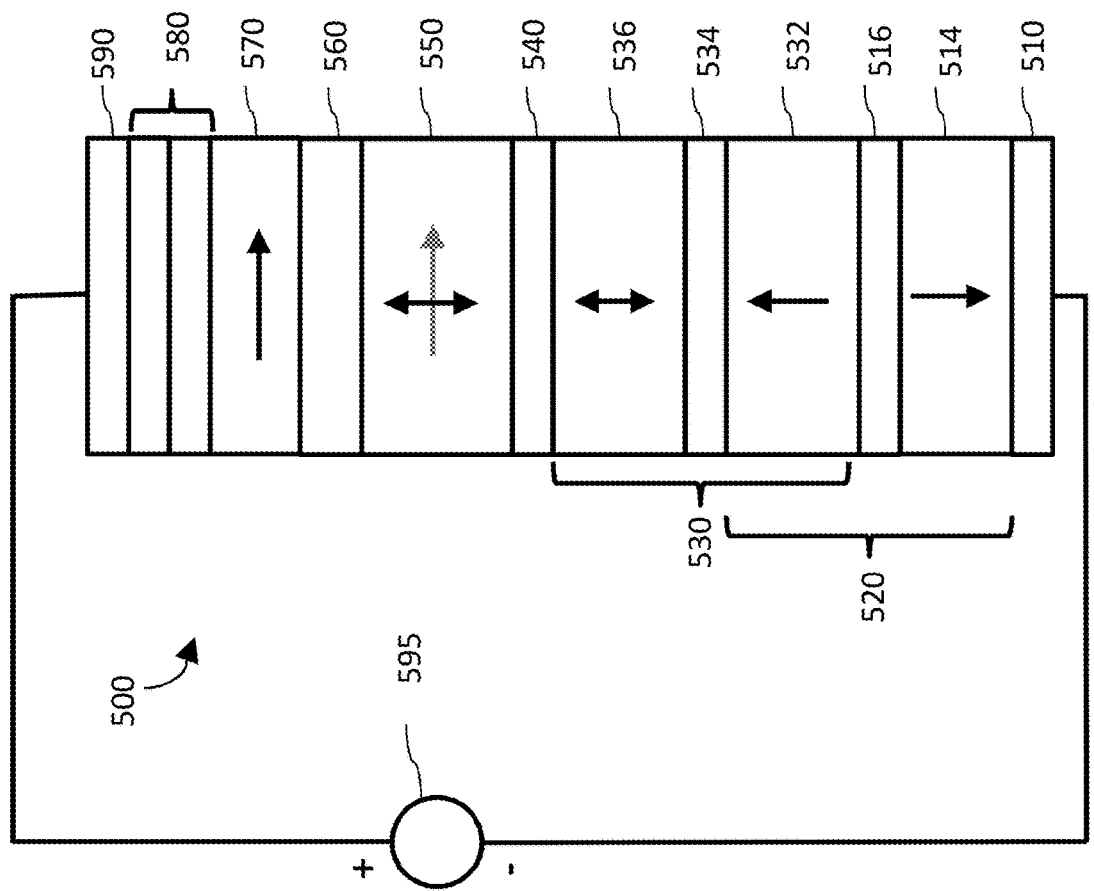
FIG. 8 illustrates an MTJ stack for an MRAM device having a polarizer layer having an orthogonal magnetic layer and a polarizer layer with a magnetization vector that can adopt a programming magnetization direction or a stabilizing magnetization direction.

A memory cell with a perpendicular MTJ, an orthogonal magnetic layer, and a polarizer layer that has a magnetization vector capable of adopting a programming direction and a stabilizing direction is shown in FIG. 8. MTJ structure 500 includes one or more seed layers 510 provided at the bottom of stack 500 to initiate a desired crystalline growth in the above-deposited layers. Synthetic antiferromagnetic (SAF) layer 520 is disposed over seed layer 510. SAF layer 520 is comprised of a first SAF layer 532, anti-ferromagnetic coupling layer 516 and second SAF layer 514. Second SAF layer 514 is deposited over seed layer 510, while anti-ferromagnetic coupling layer 516 is placed over second SAF layer 514. MTJ 530 is deposited over anti-ferromagnetic coupling layer 516. MTJ 330 includes first SAF layer 532, which acts as the reference layer of the MTJ, and is also part of SAF layer 520. A tunneling barrier layer (i.e., the insulator) 534 is disposed over first SAF layer 532 while the free layer 536 is disposed over tunneling barrier layer 534. As shown in FIG. 8, the magnetization vector of first SAF layer 532 has a magnetization direction that is preferably perpendicular to its plane, although variations of a several degrees are within the scope of what is considered perpendicular. As also seen in FIG. 8, free layer 536 also has a magnetization vector that is preferably perpendicular to its plane, but its direction can vary by 180 degrees (i.e., from the first perpendicular magnetization direction to the second perpendicular magnetization direction). Free layer 536 has a magnetization direction that is preferably perpendicular to its plane, although variations of a several degrees are within the scope of what is considered perpendicular. A nonmagnetic spacer 540 is disposed over of MTJ 530. Polarizer magnetic layer 550 is disposed over nonmagnetic spacer 540. In one embodiment, polarizer magnetic layer 550 has a magnetization vector that can be perpendicular to the plane (i.e., the stabilizing direction) or parallel to the plane (i.e., the programming direction). Polarizer 550 has a magnetization direction that can be preferably perpendicular to its plane, although variations of a several degrees are within the scope of what is considered perpendicular. In addition, polarizer 550 has a magnetization direction that can be preferably parallel to its plane, although variations of a several degrees are within the scope of what is considered parallel. In one embodiment, spin diffusive spacer layer 560 is disposed over polarizer 550. Orthogonal magnetic layer 570 is disposed over spin diffusive spacer layer 560. As shown in FIG. 8, in one embodiment, the magnetization vector of orthogonal magnetic layer 570 has a magnetization direction that is preferably parallel to its plane, although variations of a several degrees are within the scope of what is considered parallel. Although in some embodiments the magnetization vector of the orthogonal magnetic layer 570 can freely move within the plane, in such embodiments, the movement of the magnetization vector of orthogonal magnetic layer 570 is constrained such that the magnetization vector remains in-plane or nearly in-plane. One or more capping layers 580 can be provided on top of orthogonal magnetic layer 570 to protect the layers below on MTJ stack 500.

Nonmagnetic spacer 540 has a number of properties. For example, nonmagnetic spacer 540 physically separates the free layer 536 and the polarizer layer 550. Nonmagnetic spacer 540 promotes magnetic and/or electronic coupling of the polarizer magnetic layer 550 with the free layer 536. The nonmagnetic spacer 540 maintains coupling between the polarizer 550 and free layer 536 such that the magnetization vectors of polarizer 550 and free layer 536 are alignment-locked when the magnetization vector of polarizer layer 550 is in the stabilizing direction (i.e., perpendicular to the plane), thereby stabilizing the free layer 536. However, non-magnetic spacer 540 also maintains the coupling between the polarizer layer 550 and the free layer 532 such that the magnetization vector of the polarizer layer can switch to the programming direction (i.e., parallel to the plane) in the presence of a sufficiently strong current (i.e., programming current). Nonmagnetic spacer 540 transmits spin current efficiently from the polarizer magnetic layer 550 into the free layer 536 because it preferably has a long spin diffusion length. Nonmagnetic spacer 540 also promotes good microstructure and high tunneling magnetoresistance (TMR) and helps keep the damping constant of the free layer 536 low.

Polarizer magnetic layer 550 has at least the following properties. First, in one embodiment, the magnetization vector of polarizer magnetic layer 550 can adopt at least two magnetic directions: (1) a stabilizing magnetic direction, which is perpendicular to the plane of the layer and aligned with the magnetic direction of the free layer; and (2) a programming magnetic direction, which, in one embodiment, is in the plane of the layer and perpendicular to magnetization direction of free layer 536. In one embodiment, the MTJ stack is more stable when the magnetization vector of polarizer magnetic layer 550 is in the stabilizing direction, where it is alignment-locked to the magnetization vector of free layer 536. Thus, in the absence of an external influence, such as an electrical current of sufficient strength (i.e., the programming current) or a spin current of sufficient strength, the polarizer magnetic layer 550 remains in the stabilizing direction (i.e., aligned with free layer 536). However, in the presence of particular stimuli, such as the programming current, the magnetization vector of polarizer magnetic layer 550 can adopt the programming direction, thereby breaking the alignment-locking with free layer 536. In other embodiments, the programming direction has a substantial in-plane component, but is not entirely in the plane of polarizer layer 550. In other embodiments, the magnetization vector does one adopt one set direction upon application of the external stimuli. In each of these embodiments, the stray field from the polarizer layer 550 can destabilize the magnetization vector of the free layer 536, thereby priming the free layer for switching.

Spin diffusive spacer layer 560 separates the polarizer magnetic layer 550 from the orthogonal magnetic layer 570. Spin diffusive spacer layer is of a thickness of 2-40 Angstroms that enables a first spin current to interact with the magnetic vector of the polarizer layer 550.

Orthogonal magnetic layer 570 has a magnetization vector that has a substantial in-plane component. In one preferred embodiment, orthogonal magnetic layer 570 has a magnetization vector with a magnetization direction that is entirely in the plane of the layer. In some embodiments, the magnetization vector of the orthogonal magnetic layer 570 can freely move within the plane; however, the movement of the magnetization vector of orthogonal magnetic layer 570 is constrained such that the magnetization vector remains in-plane or nearly in-plane. In other embodiments, orthogonal magnetic layer 570 has a magnetization direction that is fixed, with a magnetization vector that has a substantial in-plane component or a magnetization vector that is entirely in the plane of the layer. In some embodiments, the direction of the magnetization vector of orthogonal magnetic layer 570 is fixed by, for example, shape anisotropy. In other embodiments, direction of the magnetization vector of orthogonal magnetic layer 570 is fixed by an antiferromagnetic pinning layer. In some embodiments, the antiferromagnetic pinning layer comprises PtMn or IrMn.

In some embodiments that include orthogonal magnetic layer 570 and polarizer layer 550, the polarizer layer 550 preferably has a $M_{eff}$ value that is nearly zero kOe, making it easier for the first spin transfer torque to change the magnetic direction of polarizer layer 550. In such embodiments, less energy will be required to change the magnetic direction of the polarizer layer 550 from the stabilizing magnetization direction to the programming magnetization direction. This will offer a number of benefits, including reduced power consumption and increased long-term stability. In some preferred embodiments, polarizer layer 550 preferably has a $M_{eff}$ value that is between 0 and 600 Oe. In other preferred embodiments, polarizer layer 550 preferably has a $M_{eff}$ value that is between 0 and 400 Oe. In yet other preferred embodiments, polarizer layer 550 has a $M_{eff}$ value that is between 0 and 200 Oe. In some preferred embodiments, polarizer layer 550 has a $M_{eff}$ value that is between 0 and 100 Oe.

Such embodiments can be described with reference to the graph in FIG. 6, discussed above. The difference between the FL curve and the $M_{eff}$ curve (depicted in FIG. 6) essentially determines the strength of the spin transfer torque that is required to bring the magnetization vector of the polarizer layer 550 in-plane (i.e., switched into the programming magnetization direction). This will affect the strength of the spin-polarized current needed to switch the polarizer layer 550 to the programming direction. The strength of the spin-polarized current will be dependent, in turn, on the size and properties of the orthogonal magnetic layer 570 and the strength of the electric current applied to the MTJ stack. Thus, there is an operational window in size for each MTJ stack having a specific set of layers, each having their own magnetic properties. For instance, for the embodiment depicted by the plot in FIG. 6, one might say that 35 to 45 nm is the operational window. Moreover, it should be understood that all three curves in FIG. 6 depend on the magnetic properties of the free layer 536 and polarizer layer 550. For example, the $M_{eff}$ curve can be altered to target smaller sizes for instance by reducing the partial PMA of the polarizer layer 550. Such PMA reduction can be achieved, for example, by increasing the thickness of the polarizer layer 550. This reduction in PMA shifts the $M_{eff}$ curve upwards, thereby shifting the operating window to smaller sizes. In some preferred embodiments, the width of the MTJ stack is preferably between 10 and 80 nm. In other preferred embodiments, the width of the MTJ stack is preferably between 20 and 60 nm. In yet other preferred embodiments, the width of the MTJ stack is preferably between 30 and 50 nm.

Seed layer 510 in the MTJ structure shown in FIG. 8 preferably comprises Ta, TaN, Cr, Cu, CuN, Ni, Fe or alloys thereof. Second SAF layer 514 preferably comprises either a Co/Ni or Co/Pt multilayer structure. First SAF layer 532 preferably comprises either a Co/Ni or Co/Pt multilayer structure plus a thin non-magnetic layer comprised of tantalum having a thickness of two to five Angstroms and a thin CoFeB layer (0.5 to three nanometers). Anti-ferromagnetic coupling layer 516 is preferably made from Ru having thickness in the range of three to ten Angstroms. Tunneling barrier layer 534 is preferably made of an insulating material such as MgO, with a thickness of approximately ten Angstroms. Free layer 536 is preferably made with CoFeB deposited on top of tunneling barrier layer 534. Free layer 536 can also have layers of Fe, Co, Ni or alloys thereof. Spacer layer 540 over MTJ 530 can be any non-magnetic material such as 2 to 20 Angstroms of ruthenium, 2-20 Angstroms of Ta, 2-20 Angstroms of TaN, 2-20 Angstroms of Cu, 2-20 Angstroms of CuN, or 2-20 Angstroms MgO layer. Spacer layer 540 is preferably made from MgO.

Polarizer magnetic layer 550 is preferably made from CoFeB. It can also be made with Co, Fe, Ni magnetic layers or can be made out of their alloys. The magnetic alloys can also have boron, tantalum, copper or other materials. Spin diffusive spacer layer 560 can be made from non-magnetic metals and their alloys. Spin diffusive spacer layer 560 can be any non-magnetic material such as 2 to 20 Angstroms of ruthenium, 2-20 Angstroms of Ta, 2-20 Angstroms of TaN, 2-20 Angstroms of Cu, 2-20 Angstroms of CuN, or 2-20 Angstroms MgO layer. Orthogonal magnetic layer 570 is preferably made from CoFeB. It can also be made with Co, Fe, Ni magnetic layers or can be made out of their alloys. The magnetic alloys can also have boron, tantalum, copper or other materials. Finally capping layer 580 can be any material that provides good interface to orthogonal magnetic layer such as Ta, TaN, Ru, MgO, Cu, etc.

The manner in which a bit is written using MTJ structure 500 with orthogonal magnetic layer 570 and polarizer layer 550 will now be described. The magnetization vectors of the free layer 536 and the polarizer 550 are dipole-coupled. Before application of an external stimulus (e.g., the programming current), the magnetization vectors of free layer 536 and polarizer 550 are alignment-locked. As seen in FIG. 7*a*, the free layer 536 has a magnetization direction that is perpendicular to its plane and facing upwards (i.e., in the first perpendicular magnetic direction). The magnetic vector of polarizer 550 is in the stabilizing magnetic direction, which is aligned with the free layer 536. Stray fields from the free layer 536 act on the magnetization vector of polarizer layer 550 to keep the magnetization vector of the polarizer layer 550 in the stabilizing direction. The perpendicular magnetic and/or electronic coupling between polarizer 550 and free layer 536 (i.e., the alignment-locking, depicted as field lines 600 in FIG. 7*a*) stabilizes the magnetization vector of free layer 536, reducing the probability that stochastic fluctuations will lead to unwanted switching of the free layer 536. In this way, the device exhibits enhanced memory retention over time and can have improved resilience to a greater variety of external stimuli.

Figure 7:
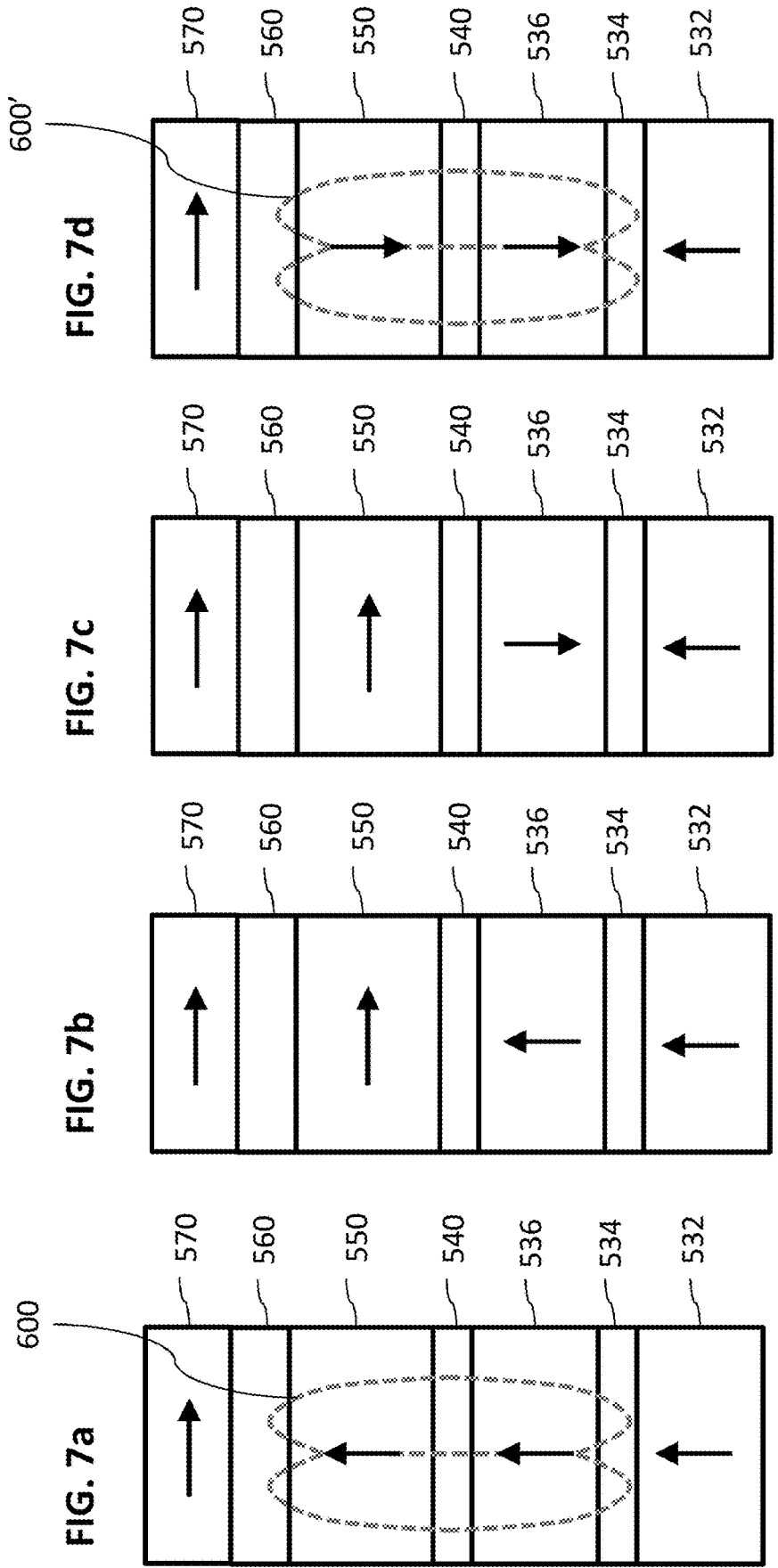
FIGS. 7a-7d illustrate the switching process for an MRAM device having an orthogonal magnetic layer and a polarizer layer with a magnetization vector that can adopt a programming magnetization direction or a stabilizing magnetization direction.

FIG. 7 depicts the process for switching the free layer of one embodiment of the disclosure described herein. Upon application of the programming current to the magnetic device, two distinct magnetic processes occur that lead to writing the bit: first, the magnetization vector of polarizer layer 550 is switched from the stabilizing direction to the programming direction (compare FIG. 7*a* to FIG. 7*b*); and second, the magnetization vector of free layer 536 is switched from the first perpendicular direction to the second perpendicular direction (compare FIG. 7*b* to FIG. 7*c*).

In the example shown in FIG. 7, the programming current flows through the layers of the device in the following order: (1) the orthogonal magnetic layer 570, (2) the spin diffusive spacer 560, (3) the polarizer 550, (4) the non-magnetic spacer 540; (5) the free layer 536, (6) the tunneling barrier layer 534; and (7) the reference layer 532. Application of the programming current generates a first spin-polarized current, which is caused in part by the transverse spin current from the substantially in-plane or entirely in-plane magnetization vector of the orthogonal magnetic layer 570. Thus, the first spin current exerts a first spin transfer torque on the magnetization vector of polarizer 550 that has an in-plane component that is in the same direction as the magnetic direction of the orthogonal magnetic layer 570. In some embodiments, this causes the magnetic vector of the polarizer 550 to switch to the magnetic direction aligned with the orthogonal magnetic layer 570 (i.e., the programming magnetic direction). In such embodiments, the magnetic vectors of the polarizer 550 and the orthogonal magnetic layer 570 are arranged in a parallel orientation when this process has completed (as depicted in FIG. 7*b*). In other embodiments, the magnetic direction of polarizer 550 is not fully in plane and therefore has only an in-plane component of the magnetic vector that is parallel to the orthogonal magnetic layer 570. In yet other embodiments, the magnetization direction of the orthogonal magnetic layer 570 is fixed in the plane or nearly in the plane and the magnetization direction of the polarizer 550 becomes parallel or nearly parallel to the fixed magnetization direction of the orthogonal magnetic layer 570.

Application of the programming current to the embodiment depicted in FIG. 7 with the magnetic vector of polarizer 550 in the programming magnetic direction (i.e., the configuration depicted in FIG. 7*b*) generates the second spin-polarized current. When switching the free layer 536 from the first perpendicular magnetic direction to the second perpendicular magnetic direction (as depicted in FIG. 7), this second spin-polarized current is generated in part by the transverse spin current from the polarizer 550 and the reflected spin current from the reference layer 532. Thus, in some embodiments, the second spin-polarized current exerts a spin transfer torque on the free layer 536 having an in-plane component that is aligned with the magnetization direction of the polarizer layer 550. This spin transfer torque causes the magnetization vector of the free layer 536 to be pulled off of its perpendicular alignment towards the equatorial position, thereby initiating the precessional motion depicted in FIG. 3. This, in turn, allows the reflected spin current from the reference layer to exert a spin-transfer torque on the free layer 536 that is anti-parallel to the magnetization direction of the reference layer 536. In this way, the magnetization vector of the free layer is switched from the parallel state (i.e., the first perpendicular magnetization direction) to the anti-parallel state (i.e., the second perpendicular magnetization direction). FIG. 7*c* shows the free layer switched to the second perpendicular magnetization direction, with the polarizer still in the programming magnetic direction. In some embodiments, the free layer will not be fully perpendicular to the plane (i.e., in the second perpendicular magnetic direction) until the programming current has been terminated.

Finally, after the free layer 536 has been switched, application of the programming current to the magnetic device is terminated and no spin-polarized current is generated in the device. In the absence of the programming current, the magnetic vector of polarizer 550 once again assumes a perpendicular orientation (i.e., switches to a stabilizing magnetic direction). This occurs spontaneously because the stray fields from the perpendicular free layer 536 interact with the magnetization vector of polarizer layer 550, pushing the magnetization vector of polarizer 550 into a perpendicular orientation (i.e., a stabilizing direction). The magnetization vector of polarizer 550 remains in the stabilizing direction because the stabilizing magnetic direction is the energetically favored (i.e., lower energy) state when the magnetic vector of the free layer 536 is in a perpendicular direction. The enhanced stability is in part the result of perpendicular dipole coupling between the magnetic vectors of the polarizer 350 and the free layer 336. The perpendicular dipole coupling leads to alignment locking between the two magnetization vectors, enhancing the stability of the MTJ structure, as shown in the embodiment depicted in FIG. 7*d*.

Thus, changing the polarization magnetic layer 550 from the stabilizing magnetic direction to the programming magnetic direction during switching of free layer 536 offers at least two distinct benefits. First, when the magnetization direction of polarizer 550 has a substantial in-plane magnetization component, free layer 536 is no longer stabilized by the electronic and/or magnetic dipolar coupling with polarizer 550, thereby rendering the free layer 536 amenable to switching. Second, as described above, the programming magnetic direction of polarizer 550 has a substantial in-plane component. Thus, the polarizer can generate a spin transfer torque on the free layer 536 that has an in-plane component, thereby pushing the magnetic vector of the free layer towards the equator and assisting in switching of the free layer 536.

Although FIG. 7 describes a process of switching the magnetization vector of the free layer 536 from an parallel direction to an antiparallel direction, such switching can also occur from the antiparallel direction to the parallel direction. When switching the magnetization vector of free layer 536 from the antiparallel direction to the parallel direction, the electrons of the programming current flow through the layers of the device in the direction opposite to that which is shown in FIG. 7. In this case, the first spin current is caused in part by the reflected spin current from the substantially in-plane or entirely in-plane magnetization vector of the orthogonal magnetic layer 570. The first spin current exerts a first spin transfer torque on the magnetization vector of polarizer 550 that has an in-plane component that is in the opposite direction as the magnetic direction of the orthogonal magnetic layer 570. Similarly, the second spin current is generated in part by the reflected spin current from the polarizer 550 and the transverse spin current from the reference layer 532. This second spin current causes a second spin transfer on the magnetization vector of the free layer 336, thereby switching the magnetization vector of the free layer from the antiparallel direction to the parallel direction.

In other embodiments, the magnetization vector of the polarizer 550 does not achieve a fully in-plane magnetic direction and may not even adopt a specific discernable programming magnetic direction. Nevertheless, in these embodiments, when the magnetization vector of polarizer 550 is not in the stabilizing direction, the magnetization direction will have an in-plane component that is sufficient to exert a second spin transfer torque that can switch the magnetization direction of free layer 536. Thus, such embodiments will still offer the benefits described above: the MTJ structure will be stabilized by alignment-locking between free layer 536 and polarizer 550 in the absence of the programming current; application of the external stimulus will break this alignment locking, thereby priming the MTJ structure for switching the free layer 536; and when the polarizer 550 is not in the stabilizing direction, sufficient in-plane spin transfer torque will be generated to assist in switching the free layer 536.

Figure 9:
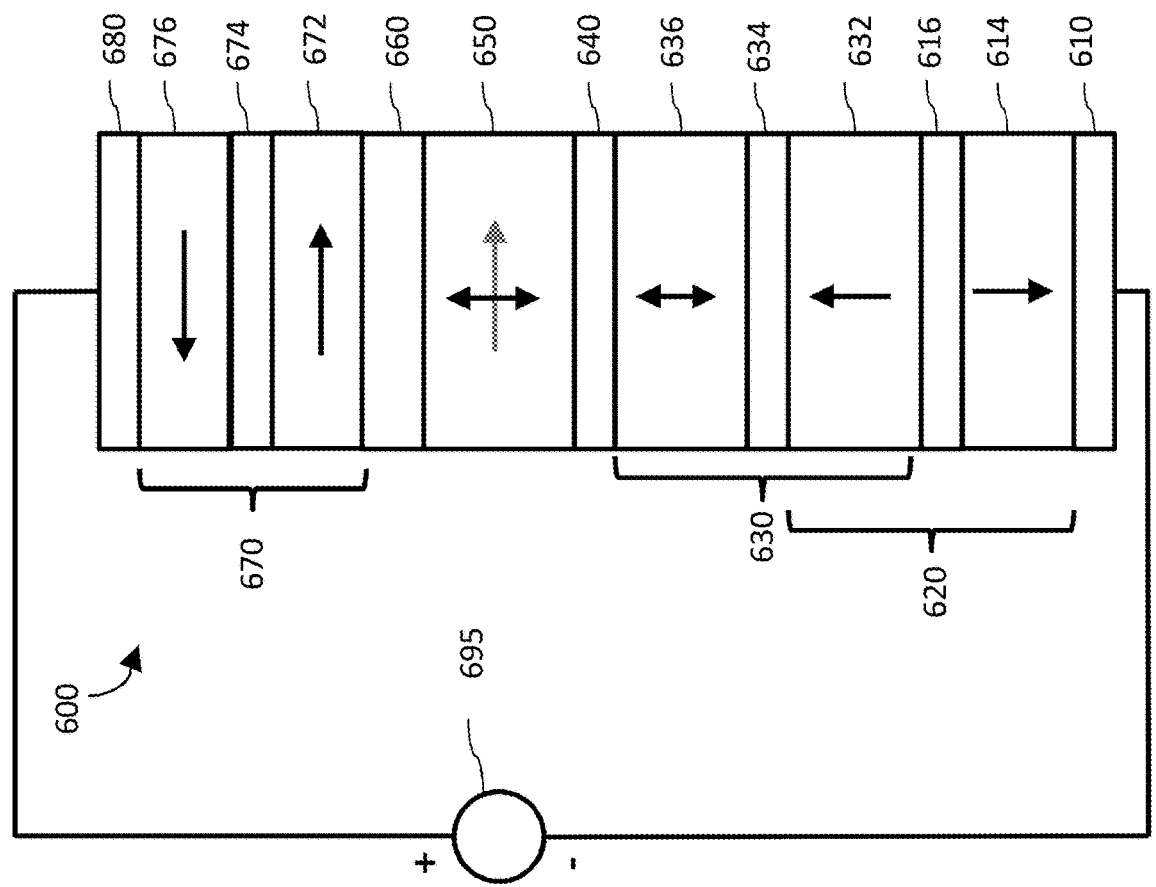
FIG. 9 illustrates an alternative embodiment of an MTJ stack for an MRAM device having an orthogonal magnetic layer that is part of an in-plane synthetic antiferromagnetic (SAF) structure and a polarizer layer with a magnetization vector that can adopt a programming magnetization direction or a stabilizing magnetization direction.

In some embodiments, such as the alternative embodiment 600 (depicted in FIG. 9), the orthogonal magnetic layer 672 is part of an in-plane SAF structure 670. In such embodiments, orthogonal magnetic layer 672 is also the first in-plane SAF magnetic layer 672 of in-plane SAF structure 670. Like magnetic device 500, magnetic device 600 includes a seed layer 610. Perpendicular synthetic antiferromagnetic (SAF) layer 620 is placed over seed layer 610. Perpendicular SAF layer 620 is comprised of a first perpendicular SAF layer 632, which is also the reference layer of device 600, anti-ferromagnetic coupling layer 616 and second perpendicular SAF layer 614. Anti-ferromagnetic coupling layer 616 is placed over second perpendicular SAF layer 614. First perpendicular SAF layer 632 (i.e., reference layer) is placed over the anti-ferromagnetic coupling layer 616. First perpendicular SAF layer 632 is the reference layer 632 of MTJ 630, which is placed over anti-ferromagnetic coupling layer 616. MTJ 630 is generally constructed of free layer 636 (which is placed over tunneling barrier layer 634) and reference layer 632. Free layer 636 and reference layer 632 are spatially separated from each other by tunneling barrier layer 634, which is made of an insulating material. Free magnetic layer 636 and reference magnetic layer 632 have the same properties, construction and characteristics as free magnetic layer 536 and reference magnetic layer 532, respectively. Nonmagnetic spacer 640 is placed over MTJ 630. Nonmagnetic spacer 640 has the same properties, construction and characteristics as nonmagnetic spacer 540, discussed above. Polarizer magnetic layer 650 is placed over nonmagnetic spacer 640. Polarizer magnetic layer 650 has the same properties, construction and characteristics as polarizer magnetic layer 550, discussed above. Spin diffusive layer 660 is placed over polarizer layer 650. Spin diffusive layer 660 has the same properties, construction and characteristics as orthogonal spin diffusive layer 560, discussed above. In-plane SAF structure 670 is placed over spin diffusive layer 660. In-plane SAF structure 670 comprises first in-plane SAF magnetic layer 672, which is also the orthogonal magnetic layer 672 of device 600, and second in-plane SAF magnetic layer 676. First in-plane SAF magnetic layer 672 and second in-plane SAF magnetic layer 676 are separated by in-plane SAF spacer layer 674. In some embodiments, first in-plane SAF magnetic layer 672 has the same properties, construction and characteristics as orthogonal magnetic layer 570, discussed above. Finally, one or more capping layer 680 is placed over in-plane SAF structure 670. Current can be provided by a current source 695. Other than the fact that orthogonal layer 672 is part of an in-plane SAF structure 670, magnetic device 600 operates in the same manner as described with respect to the embodiment shown in FIG. 8. Thus, just as shown in FIG. 7, polarizer magnetic layer 650 can switch between a stabilizing magnetization direction and a programming magnetization direction.

In one embodiment, the magnetization vector of first in-plane SAF magnetic layer 672 has a magnetization direction that is preferably parallel to its plane, as described above, although variations of a several degrees are within the scope of what is considered parallel. Non-magnetic in-plane SAF spacer layer 674 is disposed over the first in-plane SAF layer (i.e., orthogonal magnetic layer) 672. Second in-plane SAF magnetic layer 676 is disposed over non-magnetic in-plane SAF spacer layer 674. In one embodiment, the magnetization vector of second in-plane SAF magnetic layer 676 has a magnetization direction that is preferably parallel to its plane, although variations of a several degrees are within the scope of what is considered parallel. In the embodiment depicted in FIG. 9, the magnetization vectors of the first in-plane SAF layer 672 and the second in-plane SAF layer 676 have magnetization directions that are in an anti-parallel orientation.

First in-plane SAF magnetic layer 672 can be made with Co, Fe, Ni magnetic layers or can be made out of their alloys. The magnetic alloys can also have boron, tantalum, copper or other materials. First in-plane SAF magnetic layer 672 preferably comprises Co or an alloy of Co. First in-plane SAF magnetic layer 672 is preferably comprises CoFeB. In-plane SAF spacer layer 674 is preferably made from Ru having thickness in the range of three to ten Angstroms. Second in-plane SAF magnetic layer 676 can be made with Co, Fe, Ni magnetic layers or can be made out of their alloys. The magnetic alloys can also have boron, tantalum, copper or other materials. Second in-plane SAF magnetic layer 670 preferably comprises Co or an alloy of Co. Second in-plane SAF magnetic layer 676 is preferably comprises CoFeB.

Figure 10:
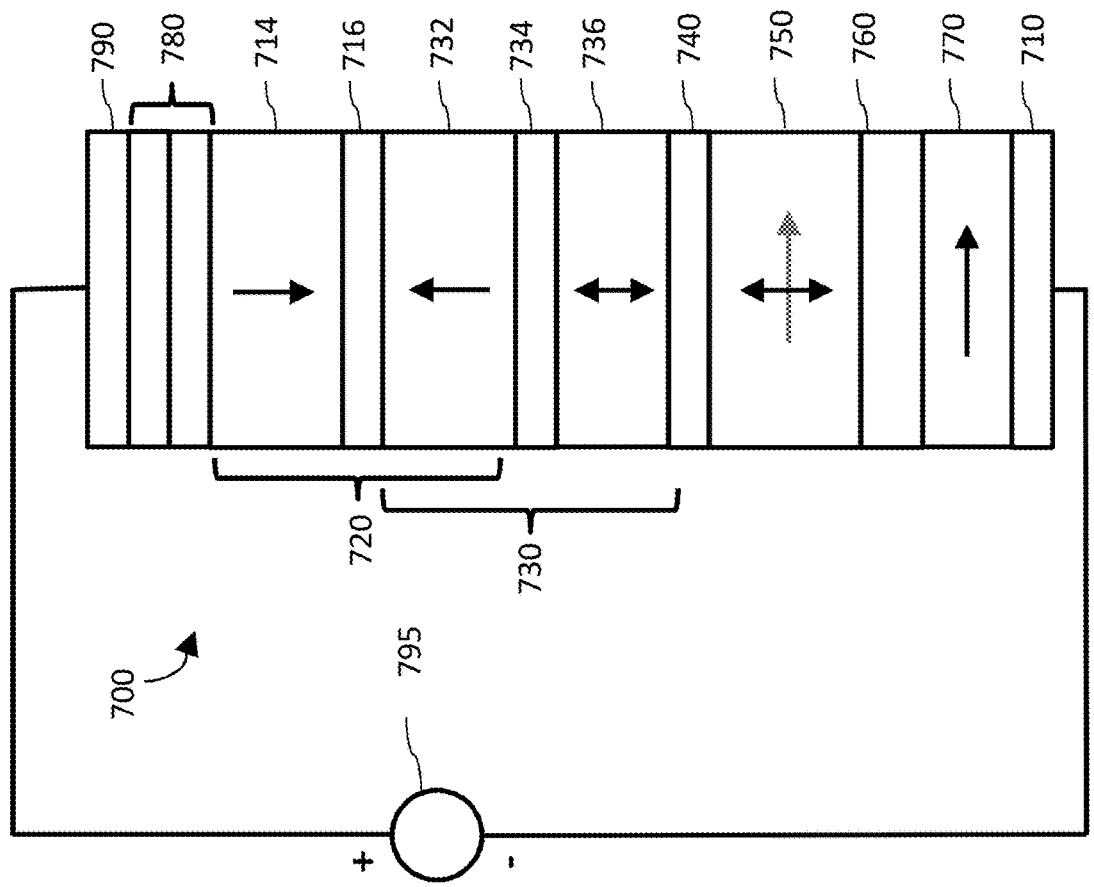
FIG. 10 illustrates an alternative embodiment of an MTJ stack for an MRAM device having an orthogonal magnetic layer and a polarizer layer with a magnetization vector that can adopt a programming magnetization direction or a stabilizing magnetization direction.

An alternative embodiment is shown in FIG. 10. In this embodiment, magnetic device 700 has had its MTJ stack inverted with respect to the embodiment shown in FIG. 8. In particular, magnetic device 700 includes a seed layer 710. Orthogonal magnetic layer 770 is placed over seed layer 710. Orthogonal magnetic layer 770 has the same properties, construction and characteristics as orthogonal magnetic layer 570. Spin diffusive layer 760 is placed over orthogonal magnetic layer 770. Spin diffusive layer 760 has the same properties, construction and characteristics as orthogonal spin diffusive layer 560, discussed above. Polarizer magnetic layer 750 is placed over spin diffusive layer 760. Polarizer magnetic layer 750 has the same properties, construction and characteristics as polarizer magnetic layer 550, discussed above. Nonmagnetic spacer 740 is placed over polarizer magnetic layer 750. Nonmagnetic spacer 740 has the same properties, construction and characteristics as nonmagnetic spacer 540, discussed above. MTJ 730 is placed over nonmagnetic spacer 740. MTJ 730 is generally constructed of free layer 736 (which is placed over nonmagnetic spacer 740) and reference layer 732. Free layer 736 and reference layer 732 are spatially separated from each other by tunneling barrier layer 734, which is made of an insulating material. Free magnetic layer 736 and reference magnetic layer 732 have the same properties, construction and characteristics as free magnetic layer 536 and reference magnetic layer 532, respectively. Tunneling barrier layer 734 also forms part of synthetic antiferromagnetic (SAF) layer 720. SAF layer 720 is comprised of a first SAF layer 732, which is also the reference layer of device 700, anti-ferromagnetic coupling layer 716 and second SAF layer 714. Anti-ferromagnetic coupling layer 716 is placed over first SAF layer 732. Finally, one or more capping layer 780 is placed over SAF layer 720. Current can be provided by a current source 795. Other than the ordering of the layers, magnetic device 700 operates in the same manner as described with respect to the embodiment shown in FIG. 8.

Thus, just as shown in FIG. 7, polarizer magnetic layer 750 can switch between a stabilizing magnetization direction and a programming magnetization direction.

All of the layers of devices 300, 500, 600 and 700 illustrated in FIGS. 5, 8, 9 and 10 can be formed by a thin film sputter deposition system as would be appreciated by one skilled in the art. The thin film sputter deposition system can include the necessary physical vapor deposition (PVD) chambers, each having one or more targets, an oxidation chamber and a sputter etching chamber. Typically, the sputter deposition process involves a sputter gas (e.g., oxygen, argon, or the like) with an ultra-high vacuum and the targets can be made of the metal or metal alloys to be deposited on the substrate. Thus, when the present specification states that a layer is placed over another layer, such layer could have been deposited using such a system. Other methods can be used as well. It should be appreciated that the remaining steps necessary to manufacture MTJ stack 300, 500, 600 and 700 are well-known to those skilled in the art and will not be described in detail herein so as not to unnecessarily obscure aspects of the disclosure herein.

It should be appreciated to one skilled in the art that a plurality of MTJ structures 300, 500, 600 and 700 can be manufactured and provided as respective bit cells of an STT-MRAM device. In other words, each MTJ stack 300, 500, 600 and 700 can be implemented as a bit cell for a memory array having a plurality of bit cells.

The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

What is claimed is:
1. A magnetic device comprising:
 a magnetic tunnel junction (MTJ) comprising a reference magnetic layer in a first plane, a non-magnetic tunnel barrier layer in a second plane, and a free magnetic layer in a third plane, the free magnetic layer and the reference magnetic layer separated by the non-magnetic tunnel barrier layer, the free magnetic layer having a magnetization vector that is perpendicular to the third plane and which precesses from a first perpendicular magnetization direction to a second perpendicular magnetization direction when a programming current passes there through, the first perpendicular magnetization direction being opposite the second perpendicular magnetization direction, the magnetic reference layer having a magnetization vector that is perpendicular to the first plane and having a fixed magnetization direction;
 a non-magnetic spacer layer in a fourth plane disposed over the free magnetic layer; and
 a polarizer magnetic layer in a fifth plane disposed over the non-magnetic spacer layer, the polarizer magnetic layer having a programming magnetization direction and a stabilizing magnetization direction, the programming magnetization direction being in the fifth plane and the stabilizing magnetization direction being perpendicular to the fifth plane;
 wherein the magnetization direction of the polarizer magnetic layer is in the programming magnetization direction when the programming current is passed through the magnetic device and wherein the magnetization direction of the polarizer magnetic layer is in the stabilizing magnetization direction when no programming current is passed through the magnetic device.

2. The magnetic device of claim 1, wherein the polarizer magnetic layer comprises Co, Fe, FeB, FeV, or CoFeB.

3. The magnetic device of claim 1, wherein the reference magnetic layer CoFeB.

4. The magnetic device of claim 1, wherein the free magnetic layer comprises CoFeB.

5. The magnetic device of claim 1, wherein the polarizer magnetic layer comprises CoFeB.

6. The magnetic device of claim 1, wherein the non-magnetic spacer layer comprises MgO.

7. The magnetic device of claim 1, wherein the non-magnetic tunnel barrier layer comprises MgO.

8. The magnetic device of claim 1, wherein the magnetization vector of the polarizer magnetic layer is switched from the stabilizing magnetization direction to the programming direction by the programming current.

9. The magnetic device of claim 1, wherein the magnetization vector of the free magnetic layer is coupled to the magnetization vector of the polarizer magnetic layer via dipolar coupling.

10. The magnetic device of claim 1, wherein the polarizer magnetic layer has a $M_{eff}$ value that is nearly zero kOe.

11. A magnetic device comprising:
a magnetic tunnel junction (MTJ) comprising a reference magnetic layer in a first plane, a non-magnetic tunnel barrier layer in a second plane, and a free magnetic layer in a third plane, the free magnetic layer and the reference magnetic layer separated by the non-magnetic tunnel barrier layer, the free magnetic layer having a magnetization vector that is perpendicular to the third plane and which precesses from a first perpendicular magnetization direction to a second perpendicular magnetization direction when a programming current passes there through, the first perpendicular magnetization direction being opposite the second perpendicular magnetization direction, the magnetic reference layer having a magnetization vector that is perpendicular to the first plane and having a fixed magnetization direction;
a non-magnetic spacer layer in a fourth plane disposed over the free magnetic layer;
a polarizer magnetic layer in a fifth plane disposed over the non-magnetic spacer layer, the polarizer magnetic layer having a programming magnetization direction and a stabilizing magnetization direction, the programming magnetization direction being in the fifth plane and the stabilizing magnetization direction being perpendicular to the fifth plane;
a spin diffusive spacer layer in a sixth plane disposed over the polarizer magnetic layer; and
an orthogonal magnetic layer in a seventh plane, the orthogonal magnetic layer separated from the polarizer magnetic layer from the spin diffusive spacer layer, the orthogonal magnetic layer having a magnetization direction that is parallel to the seventh plane;
wherein the magnetization direction of the polarizer magnetic layer is in the programming magnetization direction when the programming current is passed through the magnetic device and wherein the magnetization direction of the polarizer magnetic layer is in the stabilizing magnetization direction when no programming current is passed through the magnetic device.

12. The magnetic device of claim 11, wherein the orthogonal magnetic layer comprises Co, Fe, FeB, FeV, or CoFeB.

13. The magnetic device of claim 11, wherein the polarizer magnetic layer comprises Co, Fe, FeB, FeV, or CoFeB.

14. The magnetic device of claim 11, wherein the reference magnetic layer CoFeB.

15. The magnetic device of claim 11, wherein the free magnetic layer comprises CoFeB.

16. The magnetic device of claim 11, wherein the orthogonal magnetic layer comprises CoFeB.

17. The magnetic device of claim 11, wherein the polarizer magnetic layer comprises CoFeB.

18. The magnetic device of claim 11, wherein the non-magnetic spacer layer comprises MgO.

19. The magnetic device of claim 11, wherein the magnetization direction of the orthogonal magnetic layer is fixed.

20. The magnetic device of claim 11, wherein the magnetization vector of the polarizer magnetic layer is switched from the stabilizing magnetization direction to the programming direction by the programming current.

21. The magnetic device of claim 11, wherein the orthogonal magnetic layer is part of an in-plane synthetic antiferromagnet (SAF) structure, the in-plane SAF structure comprising a first in-plane SAF magnetic layer and a second in-plane SAF magnetic layer separated by a nonmagnetic in-plane SAF spacer layer, the first in-plane SAF magnetic layer having a magnetization vector parallel to the seventh plane, the second in-plane SAF magnetic layer having a magnetization vector parallel to the seventh plane, the non-magnetic in-plane SAF spacer layer enabling antiferromagnetic coupling between the first in-plane SAF magnetic layer and the second in-plane SAF magnetic layer.

22. The magnetic device of claim 21, wherein the first in-plane SAF magnetic layer comprises Co, the non-magnetic in-plane SAF spacer layer comprises Ru, and the second in-plane SAF magnetic layer comprises Co.

23. A magnetic device comprising:
a magnetic tunnel junction (MTJ) comprising a reference magnetic layer in a first plane, a non-magnetic tunnel barrier layer in a second plane, and a free magnetic layer in a third plane, the free magnetic layer and the reference magnetic layer separated by the non-magnetic tunnel barrier layer, the free magnetic layer having a magnetization vector that is perpendicular to the third plane and which precesses from a first perpendicular magnetization direction to a second perpendicular magnetization direction when a programming current passes there through, the first perpendicular magnetization direction being opposite the second perpendicular magnetization direction, the magnetic reference layer having a magnetization vector that is perpendicular to the first plane and having a fixed magnetization direction;
a non-magnetic spacer layer in a fourth plane;
a polarizer magnetic layer in a fifth plane, the polarizer magnetic layer and the MTJ separated by the non-magnetic spacer, the polarizer magnetic layer having a programming magnetization direction and a stabilizing magnetization direction, the stabilizing magnetization direction being perpendicular to the fifth plane, the programming magnetization direction having a magnetization component in the fifth plane;
a spin diffusive spacer layer in a sixth plane; and
an orthogonal magnetic layer in a seventh plane, the orthogonal magnetic layer and the polarizer magnetic layer separated by the spin diffusive spacer layer, the orthogonal magnetic layer having a magnetization direction with a magnetization component in the seventh plane;

wherein the magnetization direction of the polarizer magnetic layer is in the stabilizing magnetization direction in the absence of the programming current.

24. The magnetic device of claim 23, wherein the polarizer magnetic layer comprises Co, Fe, FeB, FeV, or CoFeB.

25. The magnetic device of claim 23, wherein the reference magnetic layer CoFeB.

26. The magnetic device of claim 23, wherein the free magnetic layer comprises CoFeB.

27. The magnetic device of claim 23, wherein the polarizer magnetic layer comprises CoFeB.

28. The magnetic device of claim 23, wherein the non-magnetic spacer layer comprises MgO.

29. The magnetic device of claim 23, wherein the non-magnetic tunnel barrier layer comprises MgO.

30. The magnetic device of claim 23, wherein the magnetization vector of the polarizer magnetic layer is switched from the stabilizing magnetization direction to the programming direction by the programming current.

31. The magnetic device of claim 23, wherein the magnetization vector of the free magnetic layer is alignment-locked to the magnetization vector of the polarizer magnetic layer via perpendicular dipolar coupling in the absence of the programming current.

32. The magnetic device of claim 23, wherein the polarizer magnetic layer has an $M_{eff}$ value that is nearly zero kOe.

33. The magnetic device of claim 23, wherein the orthogonal magnetic layer is part of an in-plane synthetic antiferromagnet (SAF) structure, the in-plane SAF structure comprising a first in-plane SAF magnetic layer and a second in-plane SAF magnetic layer separated by a nonmagnetic in-plane SAF spacer layer, the first in-plane SAF magnetic layer having a magnetization vector parallel to the seventh plane, the second in-plane SAF magnetic layer having a magnetization vector parallel to the seventh plane, and the non-magnetic in-plane SAF spacer layer enabling antiferromagnetic coupling between the first in-plane SAF magnetic layer and the second in-plane SAF magnetic layer.

34. The magnetic device of claim 33, wherein the first in-plane SAF magnetic layer comprises Co, the non-magnetic in-plane SAF spacer layer comprises Ru, and the second in-plane SAF magnetic layer comprises Co.

35. The magnetic device of claim 23, wherein the magnetization direction of the orthogonal magnetic layer is fixed.

36. The magnetic device of claim 35, wherein the orthogonal magnetic layer comprises PtMn or IrMn.

37. The magnetic device of claim 23, wherein the programming magnetization direction of the polarizer magnetic layer is parallel to the fifth plane.

* * * * *